United States Patent
Grouwstra et al.

(10) Patent No.: US 10,348,315 B2
(45) Date of Patent: Jul. 9, 2019

(54) FRACTIONAL-N PLL WITH SLEEP MODES

(71) Applicant: Perceptia Devices, Inc., Scotts Valley, CA (US)

(72) Inventors: André Grouwstra, Morgan Hill, CA (US); Julian Jenkins, Kurraba Point (AU)

(73) Assignee: Perceptia IP Pty Ltd, Kurraba Point, NSW (AU)

(*) Notice: Subject to any disclaimer, the term of this patent is extended or adjusted under 35 U.S.C. 154(b) by 70 days.

(21) Appl. No.: 15/795,119

(22) Filed: Oct. 26, 2017

(65) Prior Publication Data
US 2018/0138913 A1    May 17, 2018

Related U.S. Application Data

(60) Provisional application No. 62/422,736, filed on Nov. 16, 2016.

(51) Int. Cl.
| | |
|---|---|
| H03L 7/14 | (2006.01) |
| H03L 7/197 | (2006.01) |
| H03L 7/091 | (2006.01) |
| H03L 7/087 | (2006.01) |
| H03L 7/08 | (2006.01) |
| H03L 7/085 | (2006.01) |
| H03L 7/093 | (2006.01) |
| H03L 7/099 | (2006.01) |
| H03L 7/181 | (2006.01) |
| H03L 7/23 | (2006.01) |

(52) U.S. Cl.
CPC .............. *H03L 7/14* (2013.01); *H03L 7/0802* (2013.01); *H03L 7/085* (2013.01); *H03L 7/087* (2013.01); *H03L 7/091* (2013.01); *H03L 7/093* (2013.01); *H03L 7/0992* (2013.01); *H03L 7/181* (2013.01); *H03L 7/1976* (2013.01); *H03L 7/235* (2013.01); *H03L 2207/50* (2013.01)

(58) Field of Classification Search
CPC ........................................................ H03L 7/14
USPC .................................................. 331/34, 1 A
See application file for complete search history.

(56) References Cited

U.S. PATENT DOCUMENTS

| | | | |
|---|---|---|---|
| 6,885,253 B2 * | 4/2005 | Ahmed ................. | H03L 7/0802 331/34 |
| 2013/0307631 A1 * | 11/2013 | Lotfy ................... | H03K 3/0315 331/34 |

* cited by examiner

*Primary Examiner* — Joseph Chang
(74) *Attorney, Agent, or Firm* — André Grouwstra

(57) ABSTRACT

A phase-locked loop (PLL) has an oscillator, a counter and a register to sample the oscillator phase as an integer number. A phase predictor uses a fractional-N frequency control word (FCW) to calculate a predicted phase as an integer number. The integer difference between the sampled phase and the predicted phase is used as loop filter input, to generate an oscillator control signal that adjusts the oscillator frequency. The phase predictor may provide noise shaping, for example via a MASH modulator. A first sleep mode control signal blocks a reference clock and feedback of the oscillator clock to the counter. It may also freeze loop filter parameters and block the output clock. A second sleep mode control signal may stop the oscillator.

25 Claims, 18 Drawing Sheets

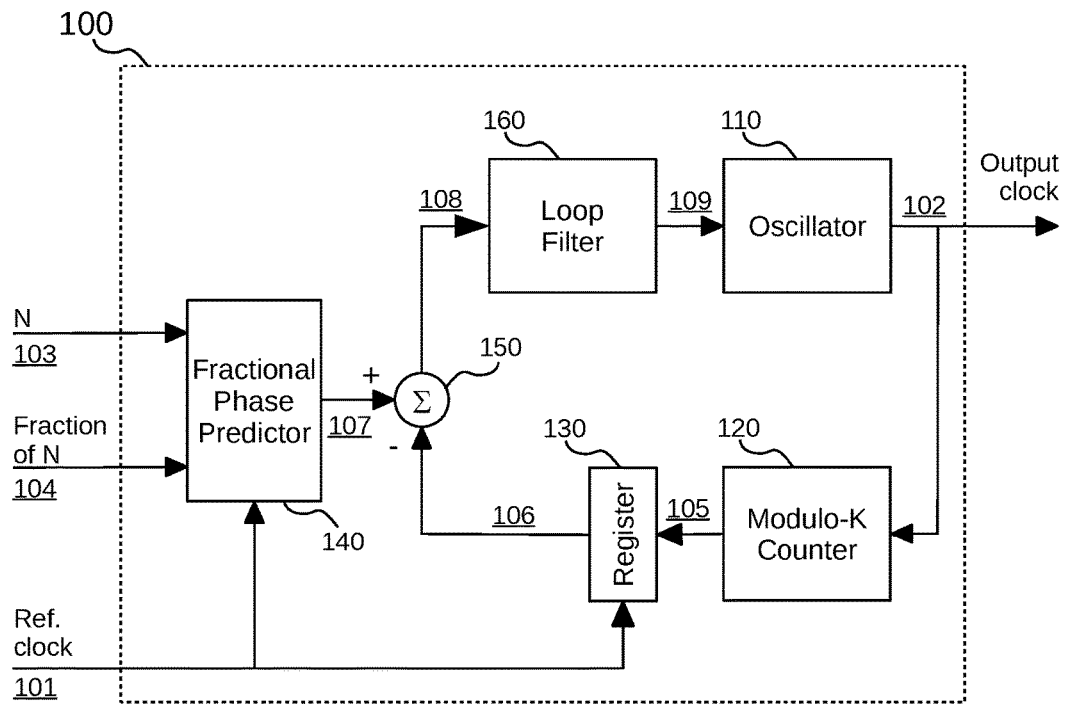
Fig. 1
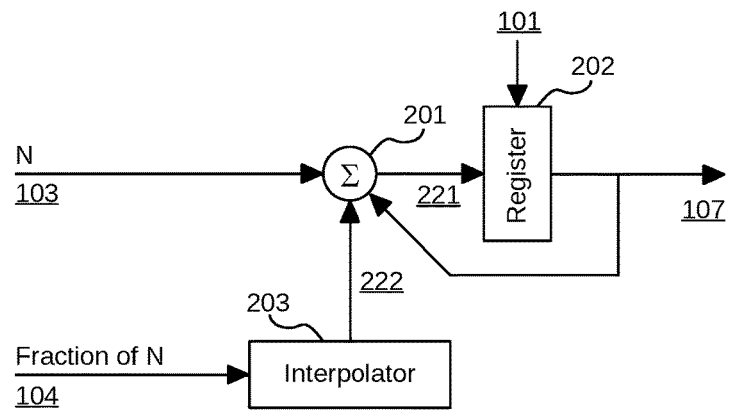
Fig. 2A – Fractional phase predictor

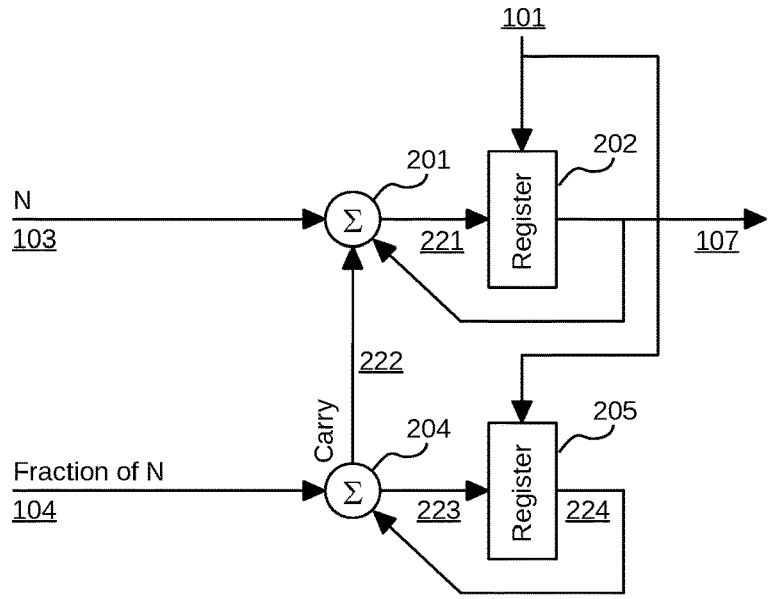
Fig. 2B – First order MASH
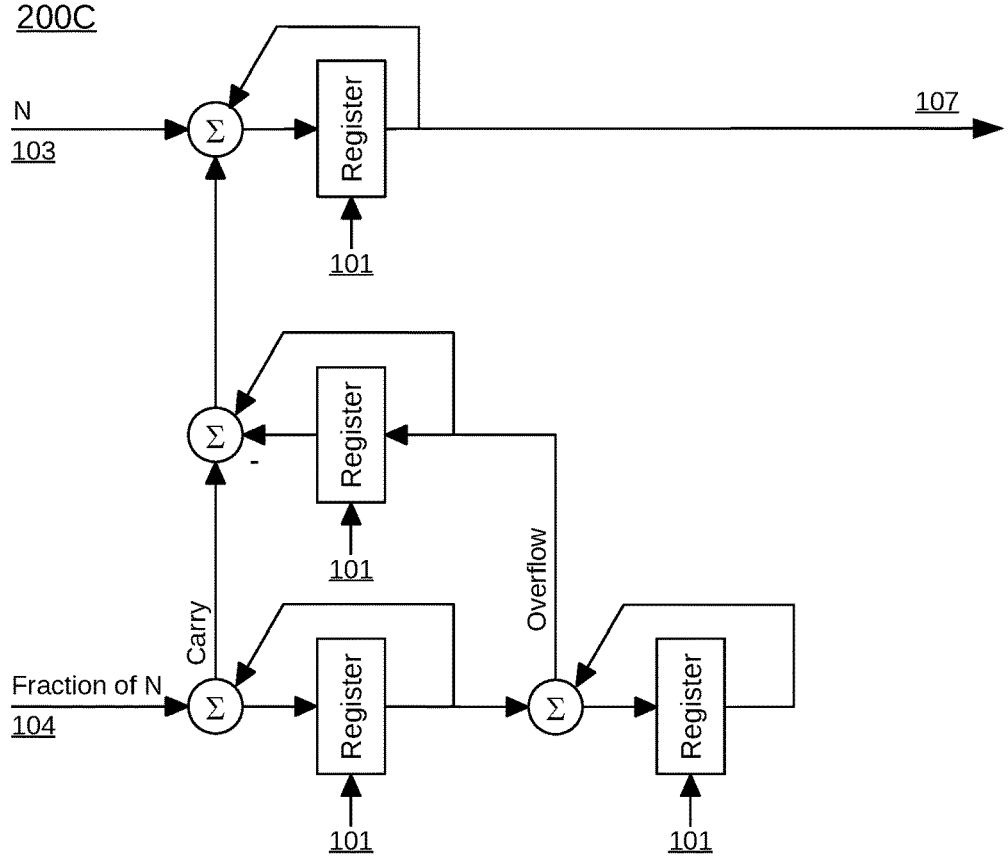
Fig. 2C – Second order MASH

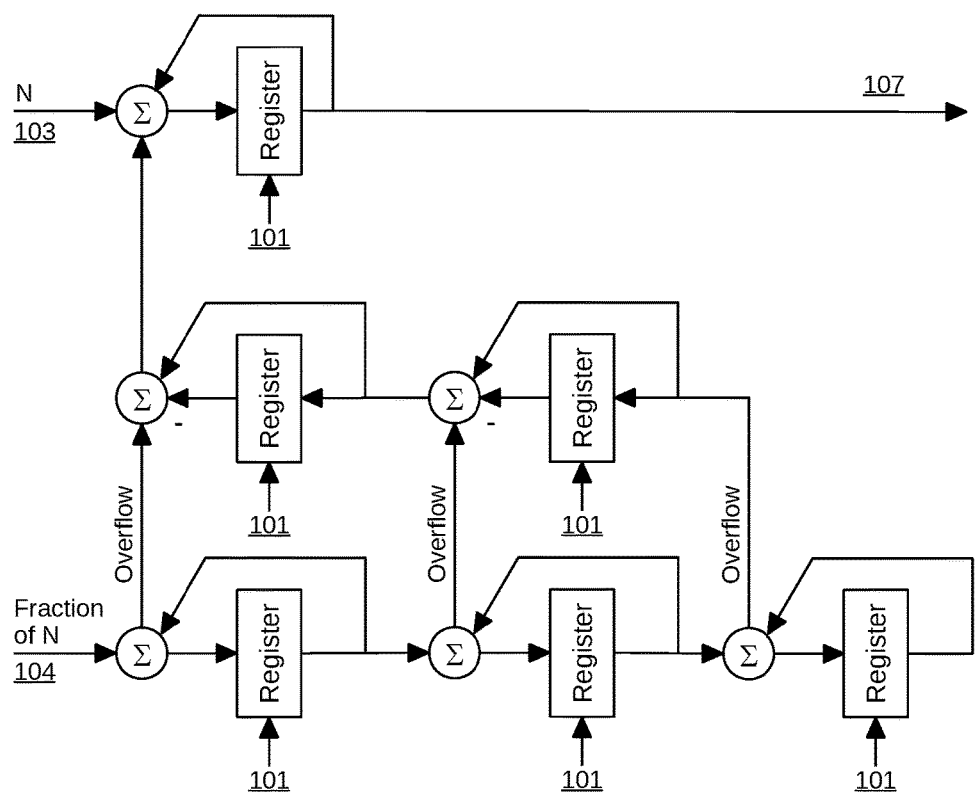
Fig. 2D – Third order MASH

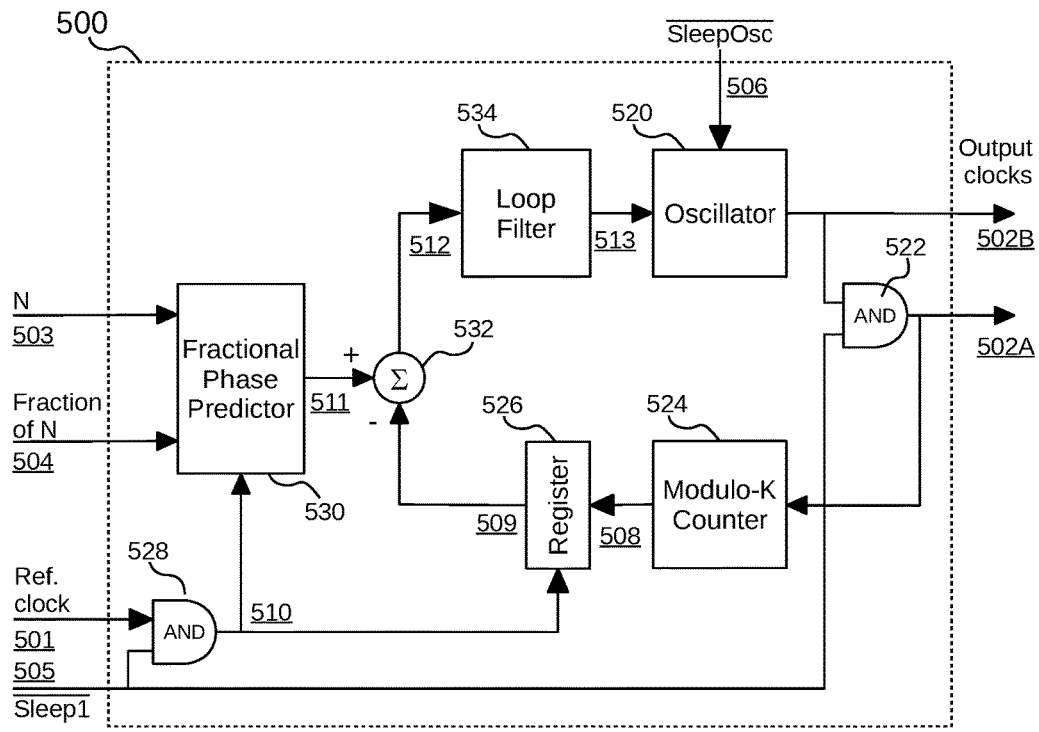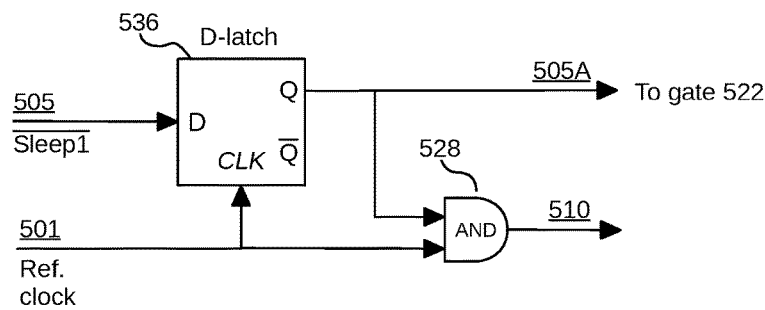
Fig. 5

1500

1510

In a primary PLL loop, based on a primary reference clock signal and a rational first FCW, calculating an integer primary predicted phase. Based on the primary reference clock signal and a secondary PLL loop output clock signal, sampling a phase at a modulo-K counter output to obtain an integer primary sampled phase. Calculating a primary difference by subtracting the primary sampled phase from the primary predicted phase.

1520

Loop filtering the primary difference in a primary loop filter to obtain a second FCW.

1530

Forwarding the second FCW to a secondary loop.

1540

Based on the second FCW and a secondary reference clock signal, calculating a secondary predicted phase. Based on the secondary reference clock signal and the secondary PLL loop output clock signal, sampling a phase to obtain a secondary sampled phase. Calculating a secondary difference by subtracting the secondary sampled phase from the secondary predicted phase.

1550

Loop filtering the secondary difference in a secondary loop filter to obtain an oscillator control signal to control a controlled oscillator and to determine a frequency of the secondary PLL loop output clock signal.

Fig. 15

FRACTIONAL-N PLL WITH SLEEP MODES

CROSS REFERENCES TO RELATED APPLICATIONS

This application claims priority from U.S. provisional patent application Ser. No. 62/422,736, entitled "Low-Power Single-Loop and Multiple-Loop Fractional-N Pas" filed on Nov. 16, 2016, which is hereby incorporated by reference as if set forth in full in this application for all purposes.

This application is related to U.S. patent application Ser. No. 15/612,908, entitled Low-Power Fractional-N PLLs, filed on Jun. 2, 2017, and to U.S. patent application Ser. No. 15/612,982, entitled Fractional-N Jitter Attenuator, also filed on Jun. 2, 2017, both of which are hereby incorporated by reference as if set forth in full in this application for all purposes. It is further related to U.S. patent application Ser. No. 15/794,847, entitled Multiple-Loop Fractional-N PLL with Hitless Switching, filed concurrently herewith, which is hereby incorporated by reference as if set forth in full in this application for all purposes.

BACKGROUND

The present invention relates generally to electronic circuits used to generate clock signals and in particular to digital phase-locked loops (PLLs).

Phase-Locked Loops (PLLs) are circuits that produce an output clock signal whose phase is locked to the phase of an input reference clock signal. Phase, in the context of a PLL, means a signal's frequency value integrated over time, i.e., the signal's accumulated number of clock pulses. The ratio of the frequency of the output clock signal and the frequency of the reference clock signal can be a positive integer number, in which case the PLL is called an integer-N PLL; or it can be a positive rational number, in which case the PLL is called a fractional-N PLL. Rational numbers are numbers that can be expressed as a ratio of two integers. In the context of this document, a fractional-N number is a positive rational number consisting of an integer part (obtained by rounding down to the nearest integer number) and a fractional part.

A PLL includes a controlled oscillator that produces the output clock signal. An analog PLL usually has a voltage-controlled oscillator (VCO), and a digital PLL may have a digitally-controlled oscillator (DCO). A PLL locks the phase (and as a result, frequency) of the output clock signal to the reference clock signal by measuring the accumulated number of output clock cycles, and adjusting the controlled oscillator frequency when the measured number deviates from a required number, calculated or obtained from a frequency control word (FCW). The ratio of output clock cycles to reference clock cycles, measured over some duration, is called the PLL's multiplication factor. When a conventional PLL is in lock, its multiplication factor matches its FCW.

Frequency-Locked Loops (FLLs) are circuits that produce an output clock signal whose frequency is locked to the frequency of an input reference clock signal. Compared to a PLL, an FLL lacks the integration or accumulation over time. A PLL's integration may occur anywhere in its loop, for example in feedback circuits, or in feedforward circuits such as a loop filter. Whereas a PLL in lock will lock both frequency and phase ratios in output and reference signals, an FLL may lock only the frequency ratio but not necessarily the phase ratio.

In an integer-N PLL, the frequency resolution of the output clock signal equals the frequency of the reference clock signal, since the output clock frequency equals a positive integer number times the reference clock frequency. Increasing or decreasing the positive integer number by one will result in the output clock frequency increasing or decreasing by one times the reference frequency. A finer output frequency resolution can be achieved by using a lower reference clock frequency. However, in practical PLLs this may increase the jitter.

A fractional-N PLL can have a much better output clock frequency resolution without the need for a low reference clock frequency, as the ratio between the output clock and reference clock frequencies can be a positive rational number. An example of a fractional-N PLL is described in U.S. Pat. No. 8,994,523, entitled Phase-Locked Loop Apparatus and Method by Jenkins. The circuits described there provide potentially very high accuracy and low jitter, but at the expense of some energy. However, there is also a need for fractional-N PLLs that consume very little power, even if they operate with more jitter.

While most PLLs and FLLs have a single feedback loop, and are capable of locking to a single reference clock signal, some PLLs have multiple parallel feedback loops, allowing to lock to one of multiple reference clock signals, not necessarily of the same frequency. The capability to switch between the different reference clock signals without facing a discontinuity in phase and therefore a possibly extended lock-in time is called hitless switching. An example hitless switching PLL is described in U.S. Pat. No. 9,007,105 by Jenkins.

A jitter attenuator is a PLL with the capability to provide an output clock signal whose jitter is substantially lower than jitter in the reference clock signal. A jitter attenuator usually has nested feedback loops. For example, it may have one or more primary feedback loops and one secondary feedback loop. The secondary loop may be locked to a highly stable reference source, such as a crystal oscillator, whereas the primary loop(s) may be locked to one or more unstable or jittery reference sources. The jitter attenuator's average output clock frequency may be locked to the frequency of one of the jittery reference sources, whereas its jitter may be determined by the stable reference source.

In many PLLs, whether used for logic clocking, video clocking, instrumentation, wireless, wired or optical communication, there is a need to lower power usage.

Reference to any prior art in the specification is not, and should not be taken as, an acknowledgment or any form of suggestion that this prior art forms part of the common general knowledge in the USA, China, Australia, or any other jurisdiction or that this prior art could reasonably be expected to be ascertained, understood and regarded as relevant by a person skilled in the art.

SUMMARY

In a first aspect (see, for example, FIG. 5), an embodiment provides a fractional-N PLL capable of maintaining phase lock over a sleep period. The PLL comprises a controlled oscillator producing an oscillator signal. A first gate, controlled by a first sleep mode control signal, blocks the oscillator signal or passes it on as a gated output clock signal. A second gate, also controlled by the first sleep mode control signal, blocks or passes a reference clock signal as a gated reference clock signal.

A modulo-K counter measures the output clock phase, and a register, upon receiving the gated reference clock signal pulse, samples the output clock phase as an integer number of clock cycles. A fractional phase predictor calculates a predicted phase as an integer number of clock cycles, based on the phase of the gated reference clock signal (i.e., the number of gated reference clock signal pulses received) and on a rational number frequency control word (FCW). A subtractor or adder calculates the difference between the sampled output clock phase and the predicted phase. A loop filter uses the difference to generate an oscillator control signal for correcting the controlled oscillator's frequency.

Some embodiments may comprise a D-latch (536 in FIG. 5) to synchronize the first sleep control signal with the reference clock signal.

In further embodiments, the controlled oscillator may stop and start operation under control of a second sleep mode control signal.

In yet further embodiments, the modulo-K counter and the fractional phase predictor may have a range that is much larger than a maximum number of output clock cycles during a reference clock signal cycle. In further embodiments, the fractional phase predictor may include an interpolator for determining an integer number part of the predicted phase based on a fractional part of the FCW. The interpolator may provide a noise-shaping function, for example a sigma delta modulator or a multistage noise shaping (MASH) modulator.

Even further embodiments may be configured to copy either a register value or the register value corrected for a current difference to a fractional phase predictor register upon receiving a first gated reference clock signal pulse after the first sleep mode control signal has been de-asserted.

In a yet even further embodiment, a loop filter uses the difference to generate an oscillator control signal for correcting the controlled oscillator's frequency. The loop filter freezes the oscillator control signal when the first sleep mode control signal is asserted. This approximately fixes the controlled oscillator frequency during a first sleep mode period.

In a second aspect (see, for example, FIG. 7), an embodiment of the invention provides a method for maintaining phase lock in a PLL over a sleep period. The PLL has an active mode and at least a first sleep mode, and the PLL is configured to receive a reference clock signal and at least a first sleep mode control signal. The method comprises: (a) during active mode, upon receiving a reference clock signal pulse, determining a controlled oscillator's phase, determining a predicted phase, and adjusting a controlled oscillator frequency based on a difference between the controlled oscillator's phase and the predicted phase; (b) receiving a change in the first sleep mode control signal; (c) upon determining that the first sleep mode control signal is asserted: canceling the active mode, entering the first sleep mode, freezing a stored value of the controlled oscillator's phase and the value of the predicted phase, freezing a phase difference, freezing loop filter internal values and a resulting oscillator control signal, blocking the reference clock signal and a gated output clock signal; and (d) upon determining that the first sleep mode control signal is not asserted: canceling the first sleep mode, entering active mode, unfreezing the stored value of the controlled oscillator's phase and the value of the predicted phase, phase difference, loop filter internal values, and the resulting oscillator control signal, unblocking the reference clock signal and the gated output clock signal to obtain a gated output clock signal that is in phase lock with the reference clock signal, and continuing with step (a).

In a third aspect (see, for example, FIG. 7), an embodiment of the invention provides a method for maintaining approximate frequency lock in a PLL whose oscillator keeps running during a sleep period, wherein the PLL has an active mode and at least a first sleep mode, and the PLL is configured to receive a reference clock signal and at least a first sleep mode control signal, the method comprising the following steps: (a) during active mode, upon receiving a reference clock signal pulse, determining a controlled oscillator's phase, determining a predicted phase, and adjusting a controlled oscillator frequency based on a difference between the controlled oscillator's phase and the predicted phase; (b) receiving a change in the first sleep mode control signal; (c) upon determining that the first sleep mode control signal is asserted: canceling the active mode, entering the first sleep mode, freezing a stored value of the controlled oscillator's phase and the value of the predicted phase, freezing a phase difference, freezing loop filter internal values and a resulting oscillator control signal, blocking the reference clock signal, and continuing to make available an ungated output clock signal as a signal in approximate frequency lock with the reference clock signal; and (d) upon determining that the first sleep mode control signal is not asserted: canceling the first sleep mode, entering active mode, unblocking the reference clock signal, unblocking an output clock signal from a PLL feedback path, and continuing with step (a).

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which:

FIG. 1 illustrates a fractional-N PLL according to an embodiment of the invention;

FIGS. 2A-D illustrate example fractional phase predictors according to embodiments of the invention;

FIG. 5 illustrates a fractional-N PLL with sleep modes according to embodiments of the invention;

FIG. 15 illustrates a method for jitter attenuation according to an embodiment of the invention;

DETAILED DESCRIPTION

Figure 3:
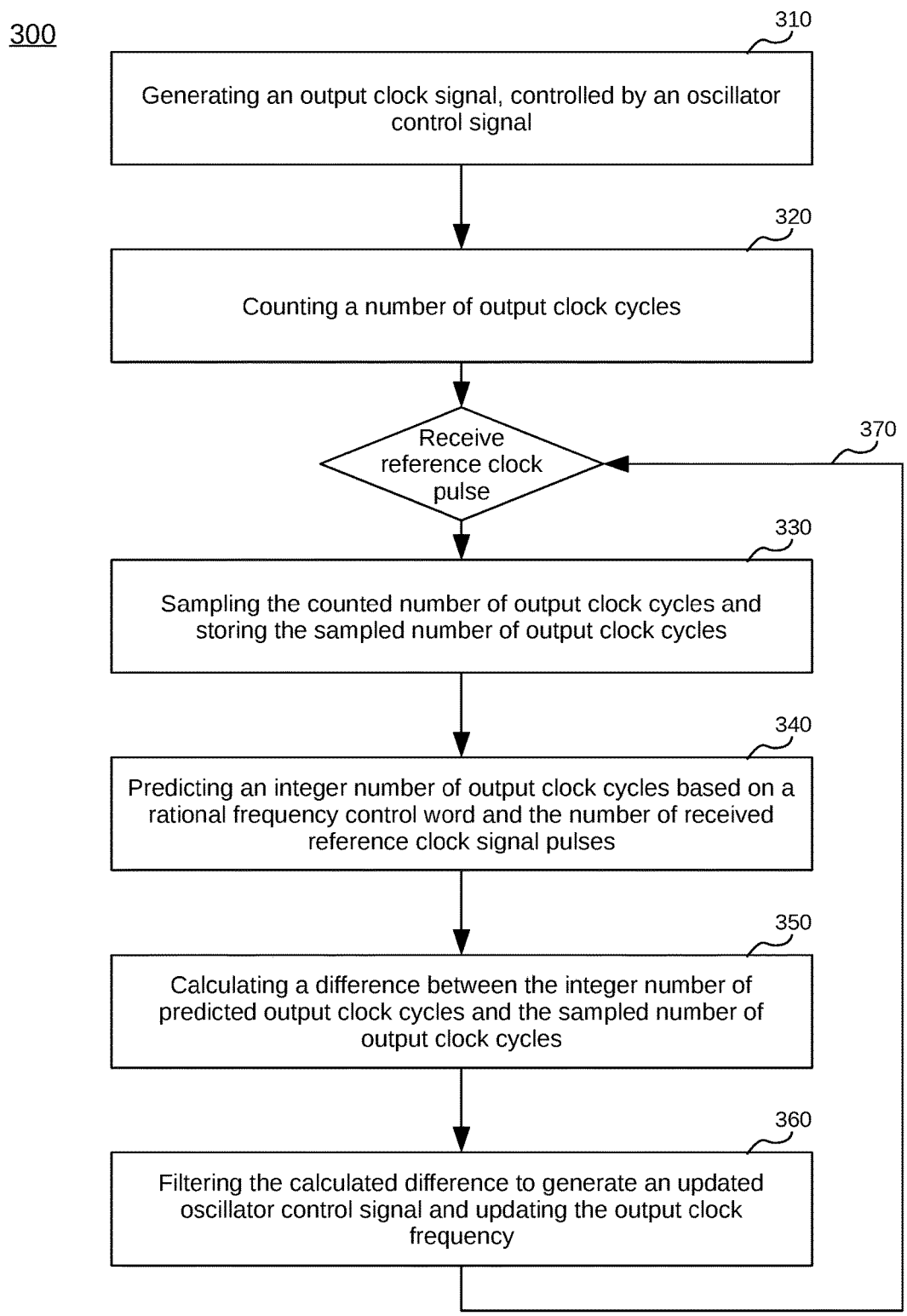
FIG. 3 illustrates a method for generating an output clock signal whose phase is locked to a reference clock signal phase by a rational number according to an embodiment of the invention.

Phase-Locked Loops (PLLs) are circuits that produce an output clock signal whose phase is locked to the phase of a reference clock input signal. Phase, in the context of a PLL, means a signal's frequency value integrated over time, i.e., the signal's accumulated number of clock pulses. The ratio of the frequency of the output clock signal and the frequency of the reference clock signal can be a positive integer number, in which case the PLL is called an integer-N PLL; or it can be a positive rational number, in which case the PLL is called a fractional-N PLL. Rational numbers are numbers that can be expressed as a ratio of two integers. In the context of this document, a fractional-N number is a positive rational number consisting of an integer part (obtained by rounding down to the nearest integer number) and a fractional part.

A digital PLL may measure the output clock phase, and compare the measured phase with a required or predicted phase. The required ratio is sometimes referred to as or obtained from a frequency control word (FCW). The ratio of oscillator output clock cycles to input reference clock cycles is called the PLL's multiplication factor. When a PLL is in lock, its multiplication factor matches its FCW. Embodiments of the invention perform measurement of the output phase by counting the output clock cycles in a modulo-K counter, which accumulates fully completed (i.e., integer) cycles only. A fractional phase predictor generates an integer comparison phase, based on the reference clock and a fractional-N FCW. The embodiments performs phase comparison using a digital subtractor (or adder). They filter the comparison result in a loop filter, and use the loop filter output to control the oscillator. Embodiments of the invention are related to (but different than) an earlier fractional-N PLL with a time-to-digital converter described in U.S. Pat. No. 8,994,523, entitled Phase-Locked Loop Apparatus and Method by Jenkins, which relied on rational rather than integer phase comparison.

A modulo-K counter, for the purposes of this patent document, is a counter that counts up to K pulses at an input, providing a counted value at an output, restarting at a start value upon counting every $K^{th}$ pulse. A modulo-K counter may count up or count down. The start value may be zero, or any other value. The counted value may be expressed as a binary number, or in any other representation of a number.

Examples in this patent document are based on up-counting from a value 0 to a value K−1, after which the counter restarts at 0. However, mutatis mutandis, all examples are equally valid for counters counting down or starting at different values. The value of K may be fixed, or it may be programmable, or it may be made to vary over time.

Basic Low-Power Fractional-N Phase-Locked Loop

FIG. 1 illustrates a fractional-N PLL 100 according to an embodiment of the invention. PLL 100 receives reference clock signal 101 and produces output clock signal 102. The frequency ratio of output clock signal 102 and reference clock signal 101 is determined by a fractional-N FCW that includes integer number N 103 and fraction of N 104. Controlled oscillator 110 produces output clock signal 102. Modulo-K counter 120 accumulates the controlled oscillator 110 frequency by counting cycles of output clock signal 102. Therefore, the modulo-K counter 120 output signal (at 105) is representative for the phase of output clock signal 102. Upon receiving a reference clock signal 101 pulse, register 130 samples phase 105, stores it, and makes it available as sampled phase 106. Register 130 may include a set of parallel latches, for example D-latches with enable and data inputs, each latch for one bit of the phase 105 code word, each latch triggered by reference clock signal 101, and each latch providing one bit of the sampled phase 106 code word.

Fractional phase predictor 140 takes integer number N 103 and fraction of N 104, and upon receiving a reference clock signal 101 pulse, fractional phase predictor 140 calculates predicted phase 107 as explained later with reference to FIGS. 2A-D. Although fractional phase predictor 140 receives a fractional-N FCW, embodiments may output predicted phase signal 107 as only an integer number. Subtractor 150 calculates a difference 108 between a required phase and a measured phase by subtracting sampled phase 106 from predicted phase 107. Loop filter 160 integrates and filters difference 108 to produce oscillator control signal 109, which controls the frequency of output clock signal 102.

The fractional-N FCW includes integer number N 103, which may have any integer value below a maximum $R_N$, where $R_N$ stands for the range of integer number N 103. It further includes fraction of N 104, which may be expressed as an integer value M below a maximum $R_M$, where $R_M$ stands for the range of fraction of N 104. The PLL 100 multiplication factor is $f_{out}/f_{ref} = (N+M/R_M)$.

Modulo-K counter 120 and fractional phase predictor 140 need to be able to track the phase of the output clock signal over a sufficiently large range. For modulo-K counter 120 this range equals K: upon reaching a counted value of K−1, the counter continues counting at 0. Naturally, the range K needs to be large enough to count $R_N$ cycles of output clock signal 102 during one cycle of reference clock signal 101. To correct large phase errors, or to relock at the correct phase after lock has been temporarily lost, embodiments of the invention may use a large range K, for instance $K \gg R_N$. For example, the range K of the modulo-K counter may be at least two times larger than a maximum number of output clock signal cycles $R_N$ during a reference clock signal cycle. Thus, the maximum value of a phase error is not limited by the period of reference clock signal 101, but by the larger of K and a range of fractional phase predictor 140. The range of fractional phase predictor 140 is clarified with reference to FIG. 2A.

FIG. 1 shows fractional-N PLL 100 as an example embodiment with up-counting modulo-K counter 120 and an up-counting fractional phase predictor 140. Other embodiments may use a down-counter and/or a down-counting fractional phase predictor. Counting limits may be chosen different than 0 and K, for example K and 0, or 0 and −K, or any other set of integer values that differ by K. Some embodiments may use an adder instead of a subtractor, and calculate the sampled phase as a negative value.

In an embodiment alternative to FIG. 1, subtractor 150 is omitted. The fractional phase predictor outputs a series of integer numbers whose average equals the FCW determined by N (103) and fraction of N (104). The embodiment programs the value of K in modulo-K counter 120 to be equal to the output number of the fractional phase predictor. Modulo-K counter 120 counts down from the pre-programmed K to zero. Upon achieving zero, modulo-K counter 120 presets to the next K value that is output by the fractional phase predictor. The embodiment interprets a counter output value that is in a range below K as a negative number, meaning that the controlled oscillator frequency is higher than the K times the reference clock signal 101 frequency. In yet another alternative embodiment, the K value is programmed similarly, however, the counter counts down between K/2 and −K/2.

FIGS. 2A-D illustrate example fractional phase predictors 200A-D according to embodiments of the invention. If fractional-N PLL 100 is in lock, then $f_{out}/f_{ref}$=FCW=(N+M/$R_M$). It follows that after c cycles of reference clock signal 101, there should be c×FCW cycles of output clock signal 102. A fractional phase predictor takes a fractional-N FCW, but it outputs an integer predicted phase, therefore, the predicted phase may have the value round (c×FCW). Thus, the predicted phase includes quantization noise. The range of a fractional phase predictor is determined by the maximum value that the predicted phase can have, i.e. the maximum value of round (c×FCW).

A most basic embodiment of a fractional phase predictor, as will also be shown in FIG. 2B, is a fractional-N accumulator, whose output bits are truncated to carry only the integer result of the accumulation. However, simple truncation may introduce a quantization noise spectrum that causes unacceptable output clock jitter in some applications. Therefore, we prefer to view the fractional phase predictor from the perspective described below. All embodiments receive the fractional-N FCW that includes integer number N 103 and fraction of N 104, as well as reference clock signal 101. They all output the predicted phase 107 as an integer number.

FIG. 2A illustrates a general embodiment 200A of fractional phase predictor 140. General embodiment 200A includes an integer-N accumulator comprising adder 201 and register 202. Adder 202 adds integer number N 103, predicted phase 107, and interpolated value 222 to produce sum 221. Upon receiving a reference clock signal 101 pulse, register 202 samples sum 221, stores it, and outputs it as an updated value of predicted phase 107. Interpolator 203 receives fraction of N 104 and outputs interpolated value 222. Interpolator 203 may provide dithering or noise shaping to change the quantization noise spectrum and move part of the quantization noise energy from low frequencies to higher frequencies. This is advantageous for fractional-N PLL 100 in FIG. 1, because loop filter 160 will generally be more effective in removing high-frequency noise than low-frequency noise, as a result of which controlled oscillator 110 will deliver a more stable output clock signal 102. Interpolator 203 may provide dithering or noise shaping through any method known in the art, for example using a sigma delta modulator, a bandpass sigma delta modulator, parallel sigma delta modulators, a multistage noise shaping (MASH) modulator, a sturdy MASH (SMASH) modulator, etc.

FIG. 2B illustrates an example fractional phase predictor 200B according to an embodiment of the invention, wherein the interpolator comprises a first order MASH modulator. Items 201 and 202, as well as signals 221 and 222 are the same as in FIG. 2A. Interpolator 203 is implemented as an accumulator of fraction of N 104, comprising adder 204 and register 205. Adder 204 sums fraction of N 104 and accumulated fraction 224 to produce sum 223. Upon receiving a reference clock signal 101 pulse, register 205 samples sum 223, stores it, and outputs it as an updated value of accumulated fraction 224. When adder 204 overflows, it outputs a carry signal as interpolated value 222 for adder 201.

MASH modulators have been well covered in the art. They were first described by T. Hayashi, Y. Inabe, K. Uchimura, and A. Iwata in *A multi stage delta-sigma modulator without double integration loop* (ISSCC Digest of Technical Papers, pp. 182-183, 1986). FIGS. 2C and 2D illustrate embodiments 200C and 200D of the invention using second and third order MASH modulators. Further embodiments may implement even higher order MASH implementation. Basically, each higher order implementation of a MASH modulator adds a stage that takes quantization noise remaining from the previous stage and moves it up to higher frequencies. Some embodiments of the invention will work as required by an application just by implementing a first order MASH interpolator, whereas other embodiments may require a second or higher order MASH or other modulator.

Although the example fractional phase predictors in FIGS. 2A-D have been described with adders to calculate a positive integer predicted phase 107, other embodiments may use subtractors and other elements to calculate the same result or to calculate a negative integer value for predicted phase 107. All such variations are within the ambit and scope of the present invention.

FIG. 3 illustrates a method 300 for generating an output clock signal whose phase is locked to a reference clock signal phase by a rational number according to an embodiment of the invention. Method 300 comprises the following steps.

Step 310—in a controlled oscillator, generating an output clock signal, wherein an output clock frequency is controlled by an oscillator control signal.

Step 320—in a modulo-K counter, counting a number of output clock cycles. The modulo-K counter may count up or down, between a minimum value, for example 0, and a maximum value, for example K−1. Once it has reached the maximum (or minimum) value, it continues counting at the minimum (or maximum) value, respectively. In some embodiments, the value of K may be much higher than a maximum value of the rational number, for example, at least two times higher.

Step 330—upon receiving a reference clock signal pulse, sampling the counted number of output clock cycles and storing the sampled number of output clock cycles in a register.

Step 340—upon receiving the reference clock signal pulse, calculating an integer number of predicted output clock cycles based on an integer number representing the reference clock signal phase and a rational frequency control word number. Embodiments may perform the calculation by accumulating at least part of the frequency control word for each newly received reference clock signal pulse. The reference clock signal phase is determined by the number of received reference clock signal pulses. An embodiment may increment the number of predicted output clock cycles with the value of the frequency control word each time it receives a reference clock signal pulse; therefore, the number of predicted output clock cycles will equal the reference clock signal phase times the frequency control word. Embodiments may further perform noise shaping by shifting quantization noise to higher frequencies, for example by using delta sigma modulators or MASH modulators. Steps 330 and 340 may occur in either order or in parallel.

Step 350—calculating a difference between the integer number of predicted output clock cycles and the sampled number of output clock cycles, and forwarding the difference to a digital loop filter.

Step 360—in the digital loop filter, filtering the calculated difference to generate an updated oscillator control signal, and in the controlled oscillator, updating the output clock frequency. The digital loop filter may have any frequency and phase transfer function as usual or as known in the art of PLL design provided that the transfer function enables PLL stability. In embodiments, filter parameters in the digital loop filter may be fixed or programmable.

Step 370—upon receiving successive reference clock signal pulses, updating the sampled number of output clock cycles and the predicted output clock cycles to provide the controlled oscillator updated oscillator control signals to lock the output clock signal phase to the reference clock signal phase.

Figure 4:
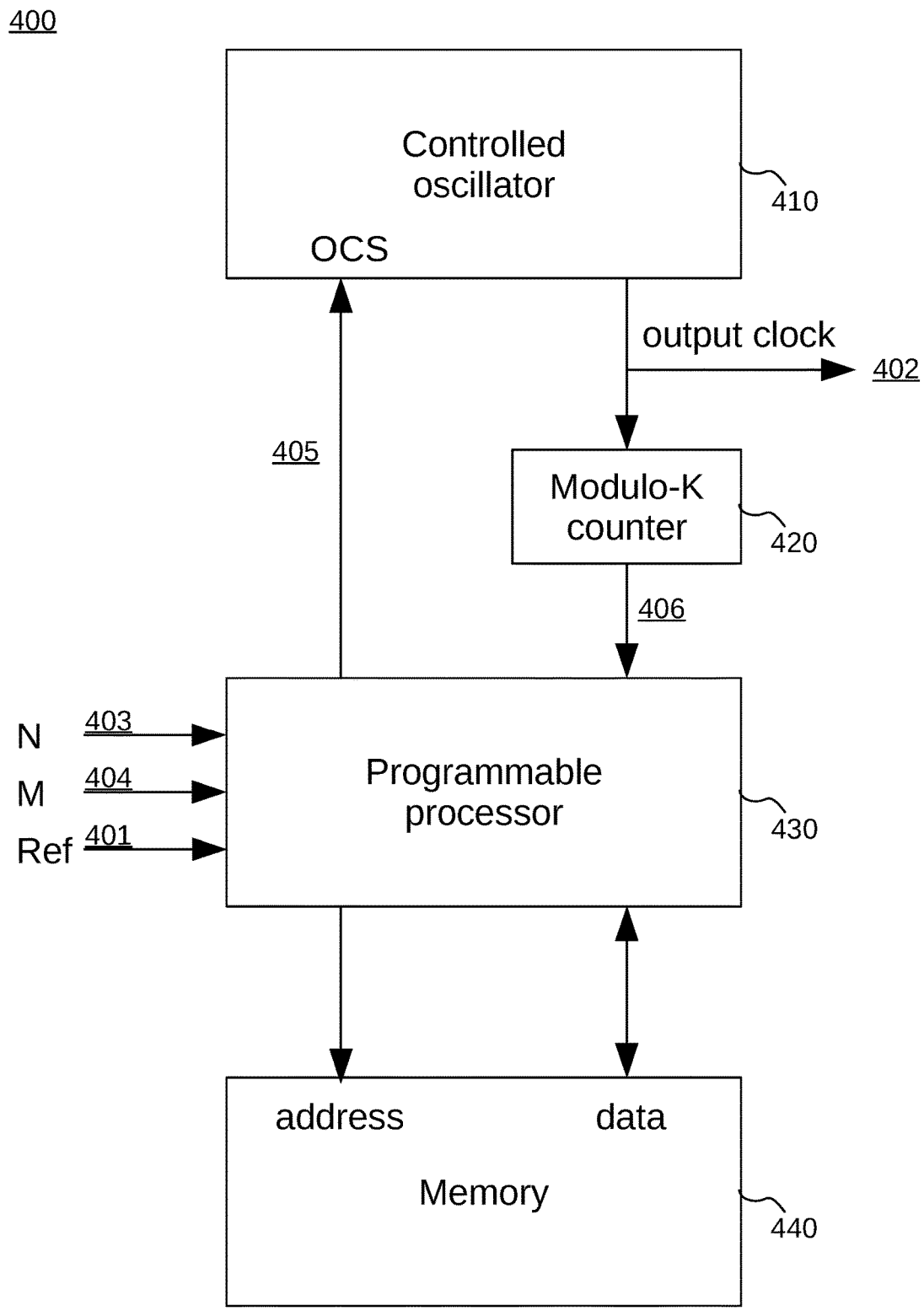
FIG. 4 illustrates a programmable system capable of implementing PLL methods according to embodiments of the invention.

FIG. 4 illustrates a programmable system 400 capable of implementing PLL methods according to embodiments of the invention. System 400 is a PLL that comprises a controlled oscillator 410, a modulo-K counter 420, a programmable processor 430, and a memory 440. Programmable system 400 is configured to store software instructions and/or data in memory 440. Programmable processor 430 receives reference clock signal 401, and a FCW comprising integer part N 403 and fractional part M 404. Programmable processor 430 outputs oscillator control signal 405 to controlled oscillator 410. Oscillator control signal 405 may include a digital code, or an analog signal such as a voltage and/or a current. Controlled oscillator 410, whose frequency is controlled by oscillator control signal 405, outputs the output clock 402. Modulo-K counter 420 counts cycles of output clock 402, and its output signal 406 is a measure for the output clock phase, which it feeds back to programmable processor 430. Some embodiments may store integer part N 403 and fractional part M 404 as parameters in memory 440, either as part of the software instructions or as part of the data. Further embodiments may receive multiple reference clock signals, and may work with multiple FCWs. Yet further embodiments may use separate memories for software instructions and data.

Programmable processor 430 may, for example, be programmed to execute instructions for the following operations:

(a) upon receiving a reference clock signal 401 pulse, sampling a modulo-K counter 420 output value 406 and storing the output value 406 as a sampled phase in a register;

(b) upon receiving the reference clock signal 401 pulse, calculating an integer number of predicted output clock cycles based on an integer number representing a reference clock signal phase and a rational number representing a FCW;

(c) calculating a difference between the integer number of predicted output clock cycles and the sampled phase;

(d) integrating and filtering the calculated difference to generate an updated oscillator control signal; and (e) upon receiving a successive reference clock signal pulse, updating the sampled phase and the number of predicted output clock cycles to provide the controlled oscillator updated oscillator control signals to lock the output clock signal phase to the reference clock signal phase.

Fractional-N PLL with Sleep Modes

FIG. 5 illustrates a fractional-N PLL 500 with sleep modes according to embodiments of the invention. Some embodiments, capable of maintaining phase lock over a sleep period (ignoring the reference clock during the sleep period), feature gated output clock signal 502A. Other embodiments, capable of maintaining approximate frequency lock while free-running during a partial sleep period, feature ungated output clock signal 502B. Yet other embodiments feature both gated output clock signal 502A and ungated output clock signal 502B.

PLL 500 is similar to PLL 100 of FIG. 1, with the addition of sleep mode control signals $\overline{\text{Sleep1}}$ (505) and $\overline{\text{SleepOsc}}$ (506) and associated gates 522 and 528. A line above a signal name indicates that the signal is asserted when it is low, however the actual level of an asserted signal is exemplary only for an embodiment and poses no limitation on the invention. PLL 500 has the following modes: active, first sleep, and in some embodiments also second sleep. In active mode, the signals $\overline{\text{Sleep1}}$ (505) and $\overline{\text{SleepOsc}}$ (506) are de-asserted. In first sleep mode, the signal $\overline{\text{Sleep1}}$ (505) is asserted and $\overline{\text{SleepOsc}}$ (506) is de-asserted. In second sleep mode, both signals $\overline{\text{Sleep1}}$ (505) and $\overline{\text{SleepOsc}}$ (506) are asserted. In active mode, PLL 500 operates the same as PLL 100. In the example embodiment drawn, $\overline{\text{Sleep1}}$ (505) may be changed synchronously to reference clock signal 501.

In active mode, controlled oscillator 520 oscillates, and its output signal, which may be available externally as ungated output clock signal 502B, passes through gate 522, which may comprise an AND gate as shown in this example, to gated output clock signal 502A and to modulo-K counter 524. Modulo-K counter 524 calculates the controlled oscillator 520 phase 508 by counting cycles of gated output clock signal 502A. Upon receiving a reference clock signal 501, passing through gate 528, which may comprise an AND gate as shown in this example, register 526 samples phase 508, stores it, and makes it available as sampled phase 509. Register 526 may include a set of parallel latches, for example D-latches with enable and data inputs, each latch for one bit of the phase 508 code word, each latch triggered by gated reference clock 510, and each latch providing one bit of the sampled phase 509 code word.

Fractional phase predictor 530 takes integer number N 503 and fraction of N 504 (together a fractional-N, i.e., rational, FCW), and upon receiving gated reference clock signal 510, fractional phase predictor 530 calculates predicted phase signal 511 such as was explained in detail with reference to FIGS. 2A-D. Although fractional phase predictor 530 receives a fractional-N FCW, embodiments may output predicted phase signal 511 as only an integer number. Subtractor 532 calculates a difference 512 between a required phase and a measured phase by subtracting sampled phase 509 from predicted phase 511. Loop filter 534 integrates and filters difference 512 to produce oscillator control signal 513, which controls the controlled oscillator 520's frequency. Oscillator control signal 513 may include a digital code, or an analog signal such as a voltage and/or a current.

The fractional-N FCW includes integer number N 503, which may have any integer value below a maximum $R_N$, where $R_N$ stands for the range of integer number N 503. It further includes fraction of N 504, which may have any integer value M below a maximum $R_M$, where $R_M$ stands for the range of fraction of N 504. The PLL 500 multiplication factor is $f_{out}/f_{ref}=(N+M/R_M)$.

Modulo-K counter 524 and fractional phase predictor 530 need to be able to track the phase of the output clock over a sufficiently large range. For modulo-K counter 524 this range equals K: upon reaching a counted value of K−1, the counter continues counting at 0. Naturally, the range K needs to be large enough to count $R_N$ cycles of gated output clock signal 502A during one cycle of gated reference clock 510. To correct large phase errors, or to relock at the correct phase after lock has been temporarily lost, embodiments of the invention may use a large range K, for instance $K \gg R_N$. For example, the range K of the modulo-K counter may be at least two times larger than a maximum number of output clock signal cycles $R_N$ during a reference clock signal cycle. Thus, the maximum value of the phase error is not limited by the period of the reference clock signal 501, but by the larger of K and the range of fractional phase predictor 530.

First sleep mode commences when signal $\overline{Sleep1}$ (505) is asserted, for example, as drawn when it is pulled low. At that time, gate 528 blocks reference clock signal 501, and gate 522 blocks gated output clock signal 502A. Therefore, modulo-K counter 524 receives no clock cycles to count, and fractional phase predictor 530 and register 526 do not update. As a result, the embodiment uses less power in modulo-K counter 524, register 526, fractional phase predictor 530, subtractor 532, and loop filter 534. Signal $\overline{SleepOsc}$ (506) may subsequently be asserted to enter second sleep mode and stop controlled oscillator 520 to save further power.

Signal $\overline{SleepOsc}$ (506) is de-asserted no later than signal $\overline{Sleep1}$ (505) is de-asserted, i.e., oscillator 520 is started no later than reference clock signal 501 and output clock signal 502 are (re-)enabled. By starting controlled oscillator 520 early and by stopping it late with reference to signal $\overline{Sleep1}$ (505), a user can isolate gated output clock signal 502A from controlled oscillator 520 start-up or power-down behavior.

To maintain phase accuracy, signal $\overline{Sleep1}$ (505) must be asserted and de-asserted synchronously to reference clock signal 502. Some embodiments may enforce synchronicity by passing signal $\overline{Sleep1}$ (505) to a D-latch 536 enabled by reference clock signal 501, and using a D-latch output signal 505A as an input signal for gates 528 and 522.

An embodiment of example fractional-N PLL 500 that does not require synchronicity of signal $\overline{Sleep1}$ (505) to reference clock signal 501 may copy either sampled phase 509 or sampled phase 509 corrected for a current difference 512 (by subtracting the current difference 512 from sampled phase 509) to a register in fractional phase predictor 530 upon receiving the first reference clock signal 501 pulse after sleep mode, such that a discontinuity in phase difference is avoided and the updated difference 512 equals zero or the current difference 512. For example, an embodiment using the fractional phase predictor 200A in FIG. 2A may copy the sampled phase 509 in FIG. 5 to register 202 in FIG. 2A. Or the embodiment may correct sampled phase 509 by subtracting a current difference 512 and copy the corrected value to register 202. However, in such an embodiment, example fractional-N PLL 500 only maintains approximate frequency lock but not phase lock over the sleep mode period.

FIG. 5 shows example fractional-N PLL 500 as an embodiment with up-counting modulo-K counter 524 and an up-counting fractional phase predictor 530. Other embodiments may use a down-counter and/or a down-counting fractional phase predictor. Counting limits may be chosen different than 0 and K, for example K and 0, or 0 and −K, or any other set of values that differ by K. Some embodiments may use an adder instead of a subtractor, and calculate the sampled phase as a negative value. FIG. 5 shows example fractional-N PLL 500 as an embodiment with AND gates for gates 522 and 528, and with the signals $\overline{Sleep1}$ and $\overline{SleepOsc}$ asserted negative. A person having ordinary skill in the art will know that gating of reference clock signal 501 and output clock signal 502A can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

Whereas the use of gated output clock signal 502A allows keeping phase lock over a period of at least the first sleep mode, ignoring any reference clock cycles during the period, the use of ungated output clock signal 502B allows maintaining approximate frequency lock while free-running during the first sleep mode. Embodiments keep the loop filter 534 output at a fixed oscillator control signal, approximately fixing the output clock signal 502B frequency. During first sleep mode, only controlled oscillator 520 is active, and example fractional-N PLL 500 can save power of operating the other included circuits.

Figure 6:
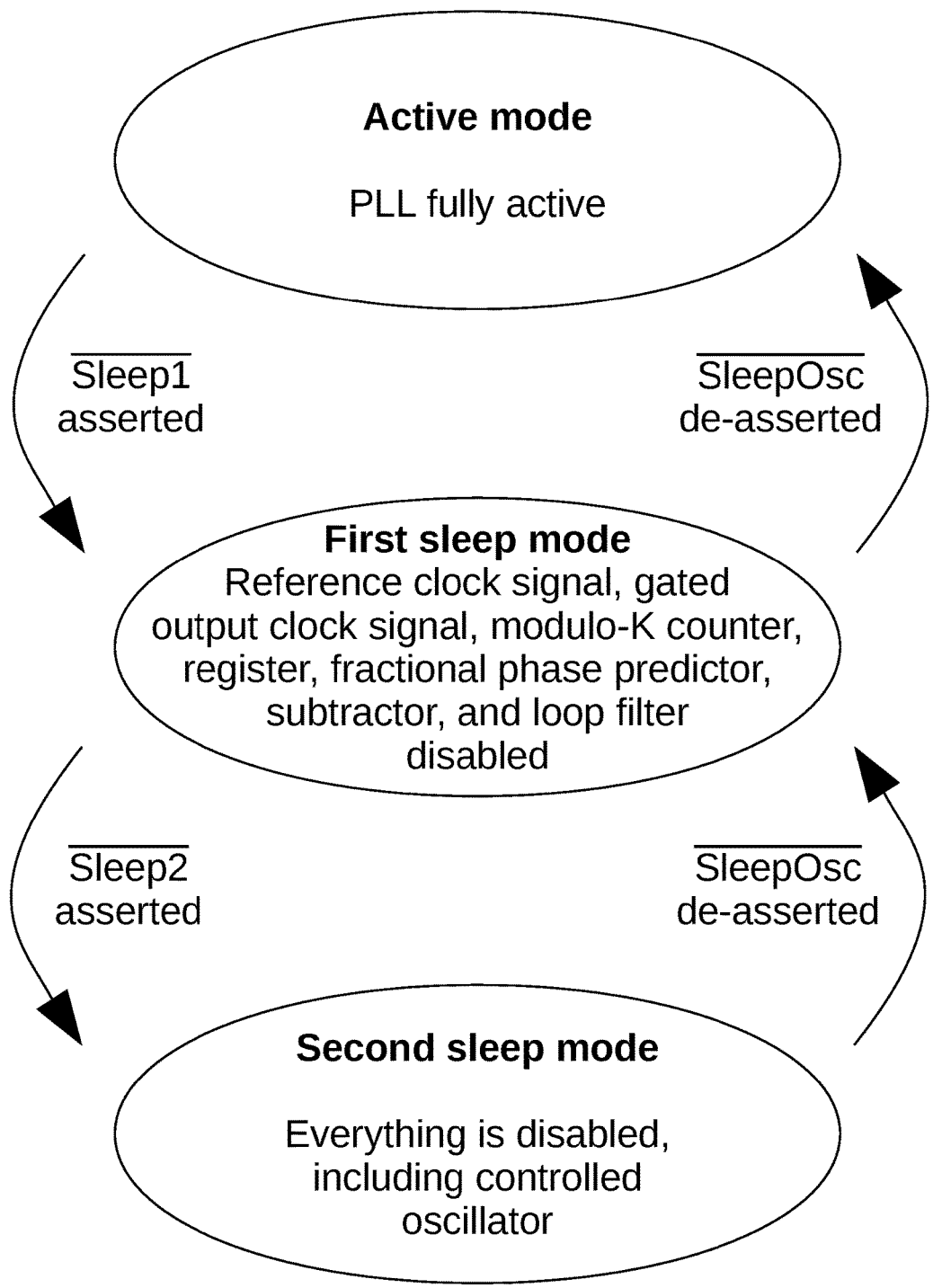
FIG. 6 illustrates a mode diagram according to an embodiment of the invention.

FIG. 6 illustrates a mode diagram 600 according to an embodiment of the invention.

Mode diagram 600 in FIG. 6 illustrates the modes in FIG. 5. There are three modes: active mode, first sleep mode, and (in some embodiments) second sleep mode. An embodiment transitions from the active mode to the first sleep mode when the signal $\overline{Sleep1}$ is asserted, and from the first sleep mode to active mode when the signal $\overline{Sleep1}$ is de-asserted. An embodiment that also has the second sleep mode transitions from the first sleep mode to the second sleep mode when the signal $\overline{SleepOsc}$ is asserted, and it transitions from the second sleep mode to the first sleep mode when the signal $\overline{SleepOsc}$ is de-asserted.

In the first sleep mode, the embodiment disables the reference clock signal, the gated output clock signal, the modulo-K counter, the register, the fractional phase predictor, the subtractor, and the loop filter. In the second sleep mode, it disables the same circuits as in the first sleep mode, as well as the controlled oscillator.

Figure 7:
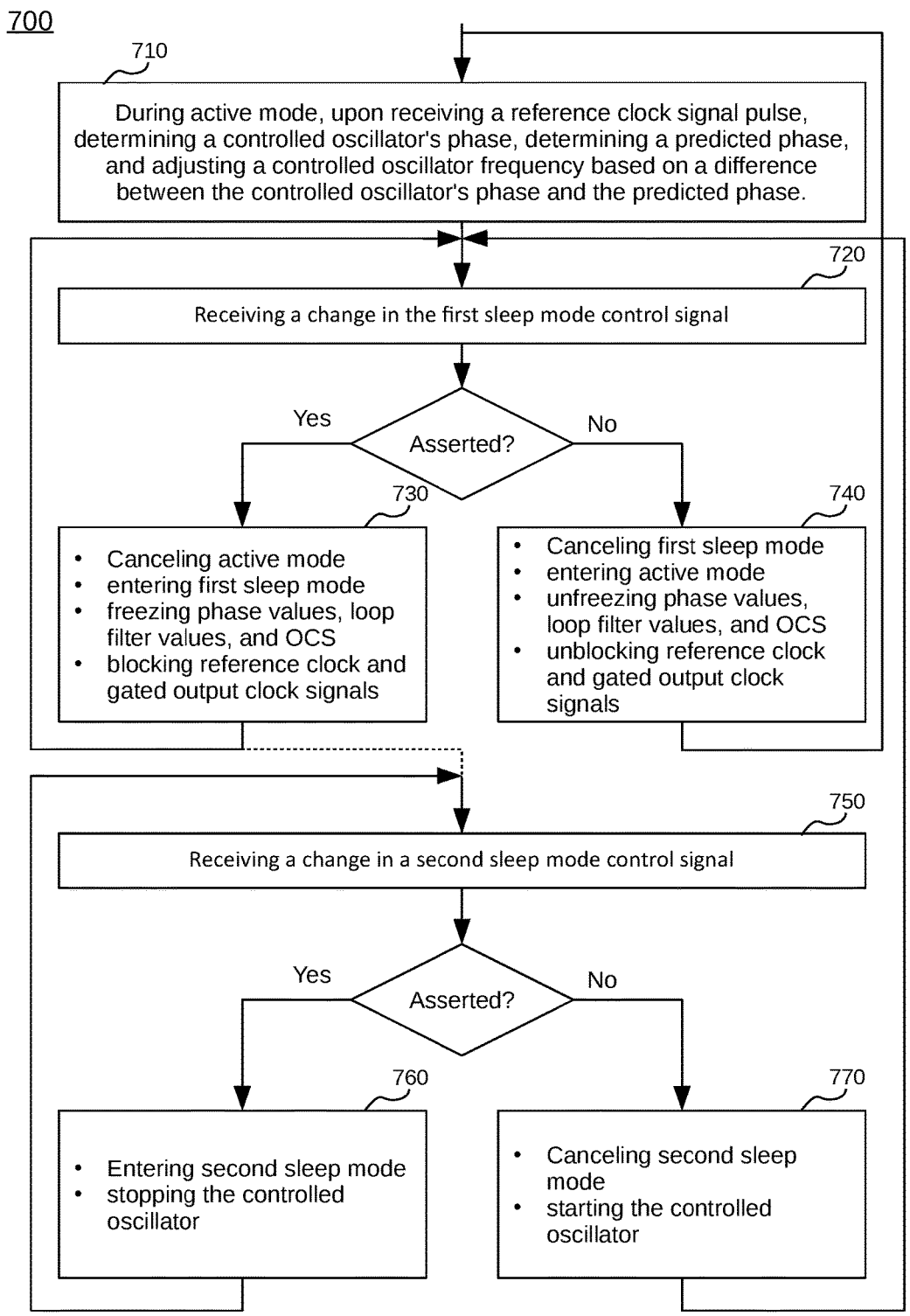
FIG. 7 illustrates a method to maintain phase lock and/or approximate frequency lock in a PLL over a sleep period according to an embodiment of the invention.

FIG. 7 illustrates method 700 to maintain phase lock and/or approximate frequency lock in a PLL over a sleep period, wherein the PLL has an active mode and at least a first sleep mode, and the PLL is configured to receive a reference clock signal and at least a first sleep mode control signal. Method 700 comprises the following steps.

Step 710—during active mode, upon receiving a reference clock signal pulse, determining a controlled oscillator's phase, determining a predicted phase, and adjusting a controlled oscillator frequency based on a difference between the controlled oscillator's phase and the predicted phase. An embodiment may sample the controlled oscillator's phase in a register and store it as an integer number. The embodiment may determine the predicted phase based on a fractional-N FCW and calculate the predicted phase as an integer number. The embodiment may perform noise shaping on the predicted phase.

Step 720—receiving a change in the first sleep mode control signal. In some embodiments, the change in the first sleep mode control signal may arrive synchronously with the reference clock signal.

Step 730—upon determining that the first sleep mode control signal is asserted:
a. canceling the active mode
b. entering the first sleep mode
c. freezing sampled and predicted phase values, phase difference, loop filter internal values, and a resulting oscillator control signal (OCS)
d. blocking the reference clock signal and a gated output clock signal
e. (optional) continuing to use an ungated output clock signal as a signal in approximate frequency lock with the reference clock signal
f. continuing with step 720.

Step 740—upon determining that the first sleep mode control signal is not asserted:
a. canceling the first sleep mode
b. entering active mode
c. unfreezing the sampled and predicted phase values, phase difference, loop filter internal values, and the resulting OCS
d. unblocking the reference clock signal and the gated output clock signal, wherein the gated output clock signal may be used as a signal in phase lock with the reference clock signal
e. continuing with step 710.

In embodiments in which the de-asserted first sleep mode control signal may arrive a-synchronously with the reference clock signal, step 740 may further comprise:
determining an updated predicted phase by copying either an updated sampled phase or a corrected updated sampled phase to a register in a fractional phase predictor, wherein the corrected updated sampled phase includes the updated sampled phase minus a current difference.

Method 700 may additionally include the following steps:
Step 750—receiving a change in a second sleep mode control signal. Note that after step 730, an embodiment may receive either a change in the first sleep mode control signal (step 720) or in the second sleep mode control signal (step 750), and in both cases it responds correctly. This means that an embodiment, after step 730, may continue with either step 720 or step 750 as required by the sleep mode control signal that is changing. The embodiment monitors both signals in parallel.

Step 760—upon determining that the second sleep mode control signal is asserted:
a. entering a second sleep mode
b. stopping the controlled oscillator
c. continuing with step 750.

Step 770—upon determining that the second sleep mode control signal is not asserted:
a. canceling the second sleep mode
b. starting the controlled oscillator
c. continuing with step 720.

Multiple-Loop Fractional-N PLL with Hitless Switching

Figure 8:
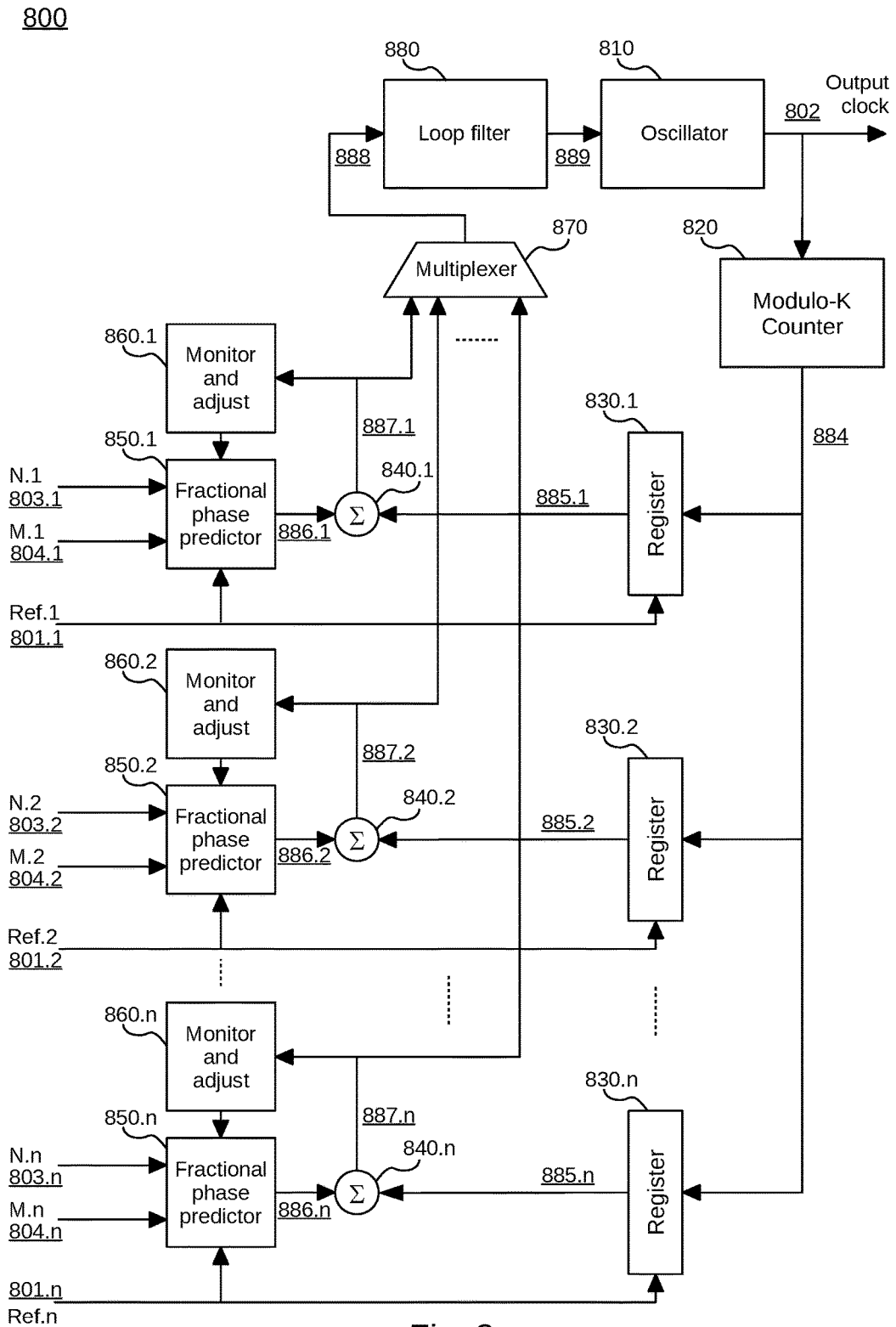
FIG. 8 illustrates a hitless switching multiple-loop PLL according to an embodiment of the invention.

FIG. 8 illustrates a hitless-switching multiple-loop PLL 800 according to an embodiment of the invention. Some applications use multiple reference clock signals. This may for instance be the case when a best reference signal is not always available, but there are some backup reference signals that can be used instead. Or, the application may have multiple active modes and each mode provides its own reference clock signal. Reference clock signals may have different frequencies, and/or different reference clock signals may need multiplication using different FCWs.

The capability to switch between the different reference clock signals without facing a discontinuity in phase and therefore a possibly extended lock-in time is called hitless switching. An example hitless switching PLL is described in U.S. Pat. No. 9,007,105 by Jenkins. Some embodiments of the present invention, as described in the following, are related to the PLL in U.S. Pat. No. 9,007,105.

Multiple-loop PLL 800 features 2 or more parallel loops (three are drawn), each dedicated to one of the reference clock signals 801.1-801.$n$, and each using a rational FCW comprising integer number N.x (803.$x$) and fraction M.x (804.$x$). Multiple-loop PLL 800 has the following common blocks, shared by all loops: controlled oscillator 810, modulo-K counter 820, multiplexer 870, and loop filter 880. Loop filter 880 receives a selected loop's phase error 888 and outputs oscillator control signal 889, which controls controlled oscillator 810. Controlled oscillator 810 generates output clock signal 802, which is also an input signal for modulo-K counter 820 that measures an integer value for phase 884. Loop filter 880 may be embodied as a digital or an analog filter, and controlled oscillator 810 may be digitally controlled or analog controlled. Embodiments in which loop filter 880 or controlled oscillator 810 is analog may include a digital-to-analog converter to perform a domain conversion at an appropriate place.

Each individual loop has a local register 830.$x$, subtractor 840.$x$, fractional phase predictor 850.$x$, and monitor-and-adjust block 860.$x$. Each register 830.$x$, upon receiving a reference clock signal 801.$x$ pulse, samples phase 884 and stores it as sampled phase 885.$x$. Each fractional phase predictor 850.$x$, upon receiving a reference clock signal 801.$x$ pulse, calculates a predicted phase 886.$x$. Each subtractor 840.$x$ subtracts sampled phase 885.$x$ from predicted phase 886.$x$ to calculate difference 887.$x$. Each difference 887.$x$ is an input signal for multiplexer 870.

Multiplexer 870 selects one of the available loops, which becomes the selected loop that includes loop filter 880, controlled oscillator 810, and modulo-K counter 820. All other loops become non-selected. A non-selected loop may be placed in sleep mode, as will be explained with reference to FIG. 9, or it may be (locally) active. In that case, a local loop is formed by the non-selected loop's local fractional phase predictor, subtractor, and monitor-and-adjust block. When a non-selected loop is locally in lock with output clock signal 802's phase, it is ready for hitless switching.

Fractional phase predictor 850.$x$ takes integer number N 803.$x$ and its fraction M 804.$x$, and upon receiving a reference clock signal 801.$x$ pulse, fractional phase predictor 850.$x$ calculates predicted phase 886.$x$ as explained earlier with reference to FIGS. 2A-D. Although fractional phase predictor 850.$x$ receives a rational FCW (803.$x$, 804.$x$), an embodiment may output predicted phase signal 886.$x$ as only an integer number.

Modulo-K counter 820 and fractional phase predictors 850.1-850.$n$ need to be able to track the phase of the output clock signal 802 over a sufficiently large range. For modulo-K counter 820 this range equals K: upon reaching a counted value of K−1, the counter continues counting at 0. Naturally, the range K needs to be large enough to count $R_N$ cycles of output clock signal 802 during one cycle of reference clock signal 801.$x$. To correct large phase errors, or to relock at the correct phase after lock has been temporarily lost, embodiments of the invention may use a large range K, where K>>$R_N$. For example, the range K of the modulo-K counter 820 may be at least two times larger than a maximum number of output clock signal cycles $R_N$ during a reference clock signal cycle. Thus, the maximum value of a phase error is not limited by the period of reference clock signal 801.$x$, but by the larger of K and a range of fractional phase predictor 850.x. The range of fractional phase predictors 850.x has been clarified with reference to FIG. 2A.

The monitor-and-adjust blocks 860.1-860.n may be active only for loops that are not selected by multiplexer 870. Monitor-and-adjust blocks 860.1-860.n monitor the differences 887.1-887.n from the respective subtractors 840.1-840.n and adjust a parameter used by fractional phase predictors 850.1-850.n to minimize these differences 887.1-887.n. The function of a monitor-and-adjust block 860.x is to maintain the minimum phase error of currently unused reference clock signal 801.x with respect to phase 884 of of output clock signal 802. Monitor-and-adjust block 860.x may further provide an indication if a non-selected loop is in lock with phase 884, and therefore ready for hitless switching. This signaling function will be further explained with reference to FIGS. 11A and B.

A simple embodiment of a monitor-and-adjust block 860.x may just copy the sampled phase 885.x into a register (not shown, but for instance register 202 in FIG. 2A) inside fractional phase predictor 850.x so that the last prediction is effectively correct. A more advanced embodiment of monitor-and-adjust block 860.x may modulate the FCW used by the loop's fractional phase predictor 850.x. It could do so by either forwarding a modulation component ΔFCW or a modulated FCW to fractional phase predictor 850.x.

For selected loop j, monitor-and-adjust blocks 860.j is not enabled. Any adjustment in the selected loop can break the desired relationship between the PLL's selected reference frequency and its output frequency.

An embodiment can be optimized to have less circuitry. For example, instead of individual monitor-and-adjust blocks 860.1-860.n, an embodiment may have a single monitor-and-adjust block that cycles through fractional phase predictors 850.1-850.n, adjusting only one at a time. As another example, an embodiment may combine hardware for all of the processing functions of the local loops, effectively reducing each local loop to a set of registers or a memory area dedicated to that loop, and it may cyclically update part or all of the loops.

In some embodiments of the invention, multiplexer 870 can be replaced by an averaging block that creates an error signal replacing selected difference 888 by the average of all the differences 887.1-887.n that are currently valid and whose monitor-and-adjust blocks 860.1-860.n have the difference 887.1-887.n associated with any valid reference clock signal 801.1-801.n close to zero. In this case, output clock signal 802 is effectively locked to all valid inputs and altering the members of the valid set has an even smaller impact on phase.

FIG. 8 shows multiple-loop PLL 800 as an example embodiment with up-counting modulo-K counter 820 and an up-counting fractional phase predictors 850.1-850.n. Other embodiments may use a down-counter and/or down-counting fractional phase predictors. Counting limits may be chosen different than 0 and K, for example K and 0, or 0 and −K, or any other set of integer values that differ by K. Some embodiments may use adders instead of subtractors, and calculate the sampled phases as negative values.

Figure 9:
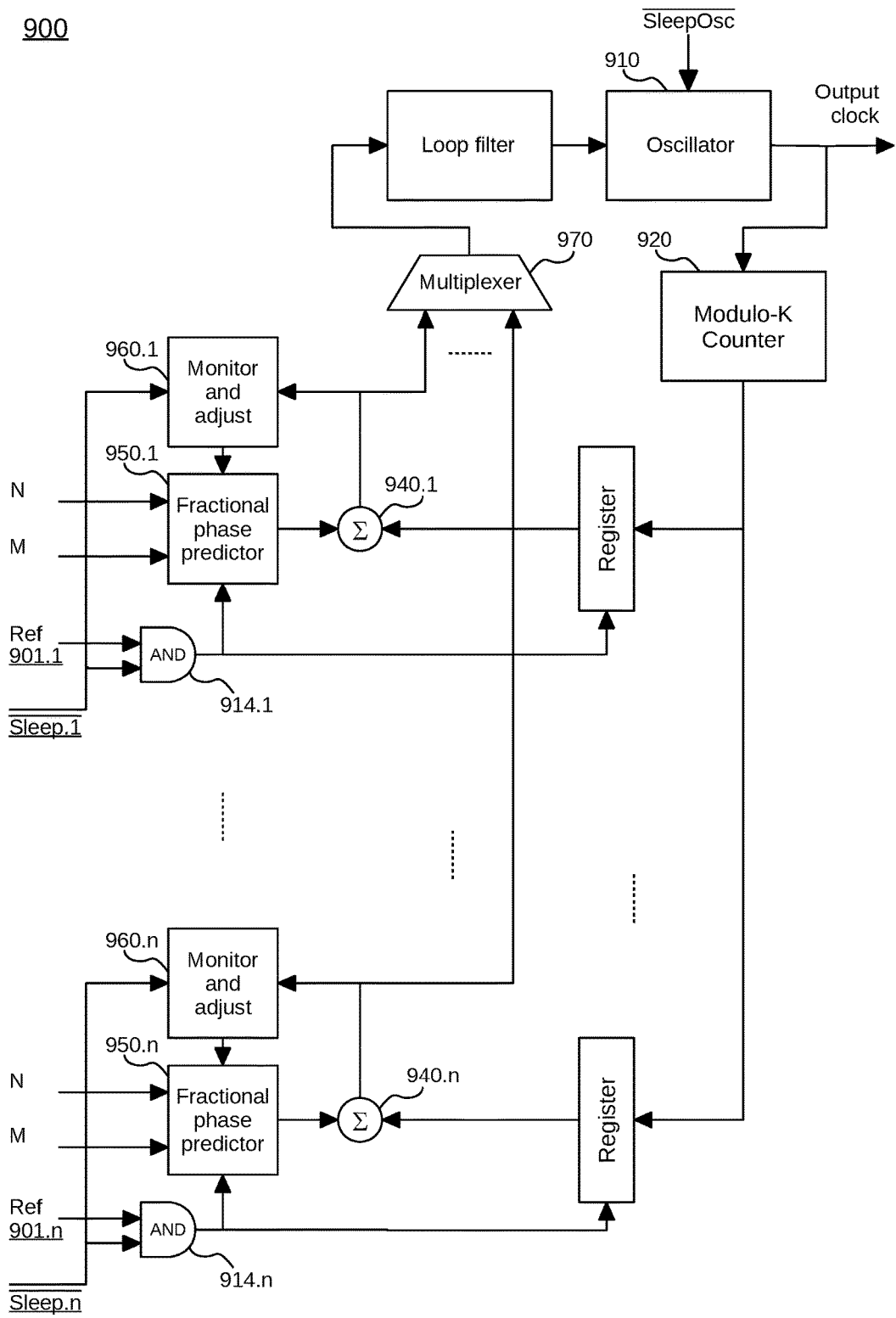
FIG. 9 illustrates a hitless switching multiple-loop PLL with sleep modes according to an embodiment of the invention.

FIG. 9 illustrates a hitless switching multiple-loop PLL 900 with sleep modes according to an embodiment of the invention. Multiple-loop PLL 900 is similar to multiple-loop PLL 800, with the addition of sleep mode(s). Each loop may have an extra input $\overline{\text{Sleep.x}}$, driving a gate 914.x, which may comprise an AND gate as shown in this example, or other combinatorial logic. Gate 914.x blocks reference clock signal 901.x in sleep mode, and passes it on in active mode. The $\overline{\text{Sleep.x}}$ signal further places monitor-and-adjust block 960.x in sleep mode. Embodiments may allow each loop individually to enter a sleep mode or active mode. Whereas multiplexer 970 will select only one loop at a time, this does not necessarily mean that all other loops can be in sleep mode. For hitless switching to occur, a loop needs to be active even while it is not selected. However, if a non-selected loop has been active for at least once cycle of reference clock signal 901.x, then, as drawn in FIG. 9, hitless switching can occur.

The embodiment may further include sleep mode signal $\overline{\text{SleepOsc}}$, which can stop operation of controlled oscillator 910. This type of sleep mode impacts all loops, and fully halts operation of multiple-loop PLL 900.

FIG. 9 shows example multiple-loop PLL 900 as an embodiment with up-counting modulo-K counter 920 and an up-counting fractional phase predictors 950.x. Other embodiments may use down-counters and/or down-counting fractional phase predictors. Counting limits may be chosen different than 0 and K, for example K and 0, or 0 and −K, or any other set of integer values that differ by K. Some embodiments may use an adder instead of subtractor 940.x, and calculate the sampled phase as a negative value. FIG. 9 shows example multiple-loop PLL 900 as an embodiment with AND gates for gates 914.1-914.n, and with the signals $\overline{\text{Sleep1}}$ and $\overline{\text{SleepOsc}}$ asserted negative. A person having ordinary skill in the art will know that gating of reference clock signals 901.1-901.n can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

Figure 10:
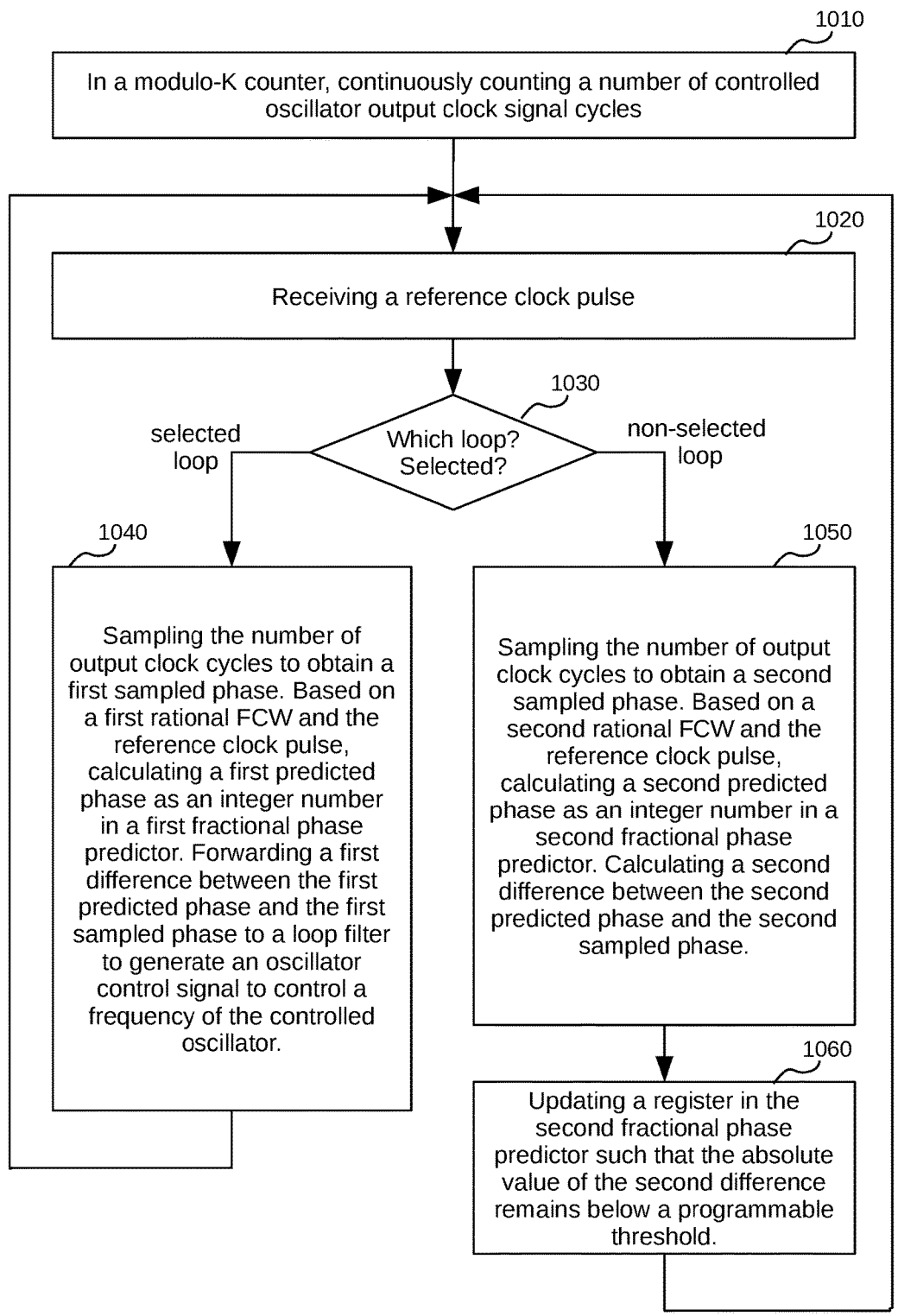
FIG. 10 illustrates a method for hitless switching in a multiple-loop PLL according to an embodiment of the invention.

FIG. 10 illustrates a method 1000 for hitless switching in a multiple-loop PLL according to an embodiment of the invention. Method 1000 comprises the following steps.

Step 1010—in a modulo-K counter, continuously counting a number of controlled oscillator output clock signal cycles to obtain an output clock phase.

Step 1020—receiving a reference clock pulse.

Step 1030—determining in which loop the reference clock pulse was received and if this loop is selected.

Step 1040—upon determining that the loop in which the reference clock pulse was received is the selected loop, sampling the output clock phase to obtain a first sampled phase. Based on a first rational FCW and the reference clock pulse, calculating a first predicted phase as an integer number in a first fractional phase predictor. Forwarding a first difference between the first predicted phase and the first sampled phase to a loop filter to generate an oscillator control signal to control a frequency of the controlled oscillator. In this, the first rational FCW and the first fractional phase predictor are associated with the selected loop. Continue with step 1020.

Step 1050—upon determining that the loop in which the reference clock pulse was received is a non-selected loop, sampling the output clock phase to obtain a second sampled phase. Based on a second rational FCW and the reference clock pulse, calculating a second predicted phase as an integer number in a second fractional phase predictor. The second rational FCW and the second fractional phase predictor are associated with the non-selected loop. Calculating a second difference between the second predicted phase and the second sampled phase.

Step 1060—updating a value used by the second fractional phase predictor such that the absolute value of the second difference remains below a threshold value that generally depends on jitter that is present in the reference clock, and on jitter that is present in the controlled oscillator signal. Since the first, and even the second, depends on the application, in a practical multiple-loop PLL the threshold value may be stored in a programmable register. Continue with step 1020.

Some embodiments may set the threshold at zero and simply copy the value of the second sampled phase into the register in the second fractional phase predictor.

Method 1000 may further comprise the following steps (not shown in FIG. 10):

Step 1070—upon receiving a loop sleep signal for a non-selected loop: disabling updating of the second sampled phase, and disabling the second fractional phase predictor.

Step 1080—upon receiving the loop sleep signal for a non-selected loop: disabling a second monitor-and-adjust function.

Step 1090—upon receiving a PLL sleep signal, disabling the controlled oscillator.

Some embodiments of the invention may implement a programmable hitless-switching multiple-loop fractional-N PLL with the system shown in FIG. 4, where programmable processor 430 receives multiple reference clocks signals 401, and receives or stores multiple FCWs with integer part 403 and fractional part 404. In these embodiments, programmable processor 430 executes software or firmware code substantially implementing parts or all of method 1000. A yet further embodiment of the invention may comprise a tangible non-transitory memory carrying software instructions for parts or all of method 1000.

Figure 11A:
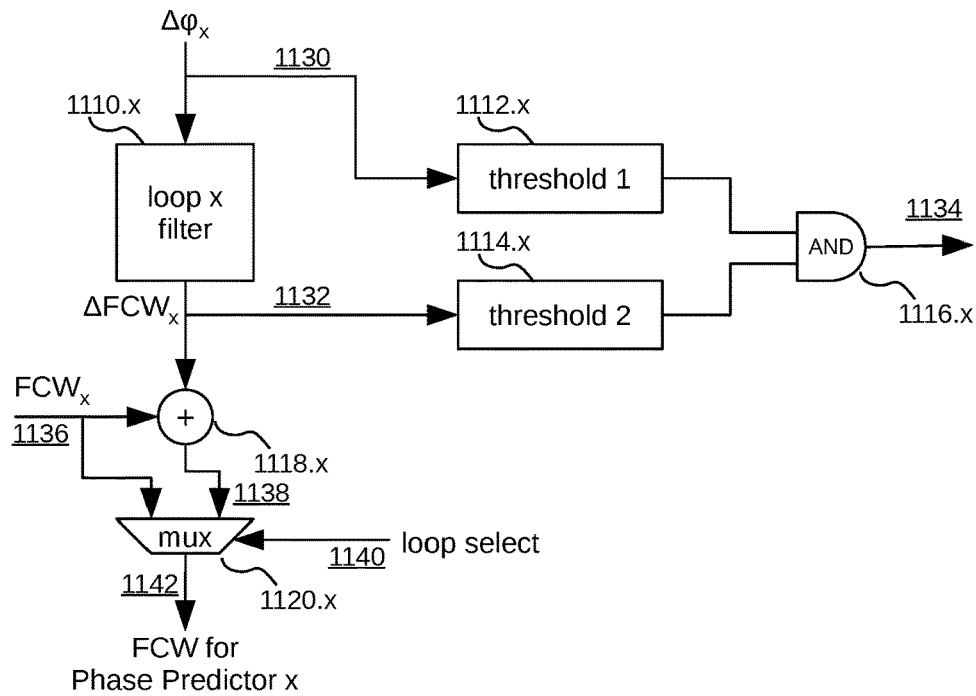
FIGS. 11A-B illustrate monitor-and-adjust blocks incorporating a shadow loop filter according to embodiments of the invention.
Figure 11B:
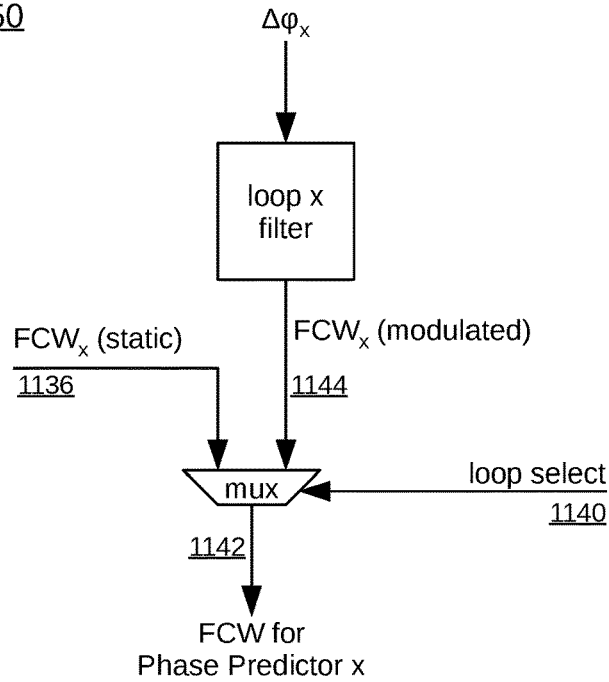

FIGS. 11A-B illustrate monitor-and-adjust blocks incorporating a shadow loop filter according to embodiments of the invention. FIG. 11A shows monitor-and-adjust block 1100 for loop number x in a multiple-loop PLL. It includes shadow loop filter 1110.x, which is configured to receive phase difference $\Delta\varphi_x$ 1130. This phase difference could be an integer phase difference, such as any of difference 887.1-887.n in FIG. 8, or it could be a rational phase difference such as described in U.S. Pat. No. 9,007,105 by Jenkins. Shadow loop filter mimics the behavior of the PLL's main loop filter, such as loop filter 880 in FIG. 8. However, unlike loop filter 880 which outputs an oscillator control signal 889, shadow loop filter 880 outputs an FCW, including an integer and a fractional part, or as in the embodiment in FIGS. 11A-B, modulation $\Delta FCW_x$ 1132 to be superposed onto $FCW_x$ 1136. The differences between oscillator control signal 889 and the shadow loop filter 1110.x output signal depend mainly on implementation choices. In an embodiment, they may have a different scale; different numbers of fractional bits; the oscillator control signal may be dithered as opposed to having fractional bits; the signals may have different DC components, etc.

Monitor-and-adjust block 1100 includes adder 1118.x to add modulation $\Delta FCW_x$ 1132 to static $FCW_x$ 1136, resulting in adder output signal 1138. Phase predictor x of loop x needs to use the static $FCW_x$ 1136 when loop x is selected, and ignore the monitor-and-adjust functionality, whereas the functionality needs to be available whenever loop x is not selected. Therefore, loop select signal 1140 directs multiplexer 1120.x to select either $FCW_x$ 1136 or adder output signal 1138 to be the FCW 1142 used for phase predictor x.

Monitor-and-adjust block 1100 is capable of flagging whether loop x is locally in lock with the phase of the PLL's output clock signal. It does so by determining if the amplitudes (absolute values) of phase difference $\Delta\varphi_x$ 1130 and shadow loop filter output signal 1132 are below thresholds 1 and 2, respectively. These thresholds depend on jitter specifications of the system in which a PLL is used, and an embodiment may store them in programmable registers. Comparator 1112.x may take the absolute value of its input signal, and assert its output if this value is larger than threshold 1. Similarly, comparator 1114.x may take the absolute value of its input signal and assert its output if the value is larger than threshold 2. Combinatorial logic 1116, which may include an AND gate, determines if the outputs of comparator s 1112.x and 1114.x are both asserted, and asserts it output signal 1134 to flag this condition, signaling that non-selected loop x is locally in lock.

A simplified embodiment may use only comparator 1112.x or comparator 1114.x and use its output signal directly as a lock flag.

FIG. 11B shows an embodiment of monitor-and-adjust block 1150 outputting a modulated FCW 1144 rather than only its modulation component. This embodiment selects directly between static $FCW_x$ 1136 when loop x is selected, and modulated FCW 1144 when loop x is not selected. It forwards the selected FCW the loop's phase predictor. The embodiment in FIG. 11B can be extended to include the functionality shown in FIG. 11A to flag that loop x is locally in lock with the phase of the PLL's output clock signal. Such an embodiment could include comparator 1112.x to flag this condition. It could include comparator 1114.x, provided that its input signal equals modulated FCW 1144 minus static $FCW_x$ 1136. In case the embodiment has both comparator 1112.x and comparator 1114.x, it further needs combinatorial logic 1116, which may include an AND gate.

Even further embodiments may implement the monitor-and-adjust function in a programmable processor as software or firmware carrying out the following method: (a) receiving a phase difference signal; (b) filtering the phase difference signal with filter characteristics mimicking a main loop filter's characteristics, to obtain an FCW modulation or a modulated FCW; (c) (optional) adding an FCW modulation to a static FCW to obtain a modulated FCW; (d) determining if loop x is selected; and (e) forwarding the modulated FCW to a phase predictor if loop x is not selected; or (f) forwarding the static FCW to the phase predictor if loop x is not selected.

Fractional-N Jitter Attenuator

Figure 12:
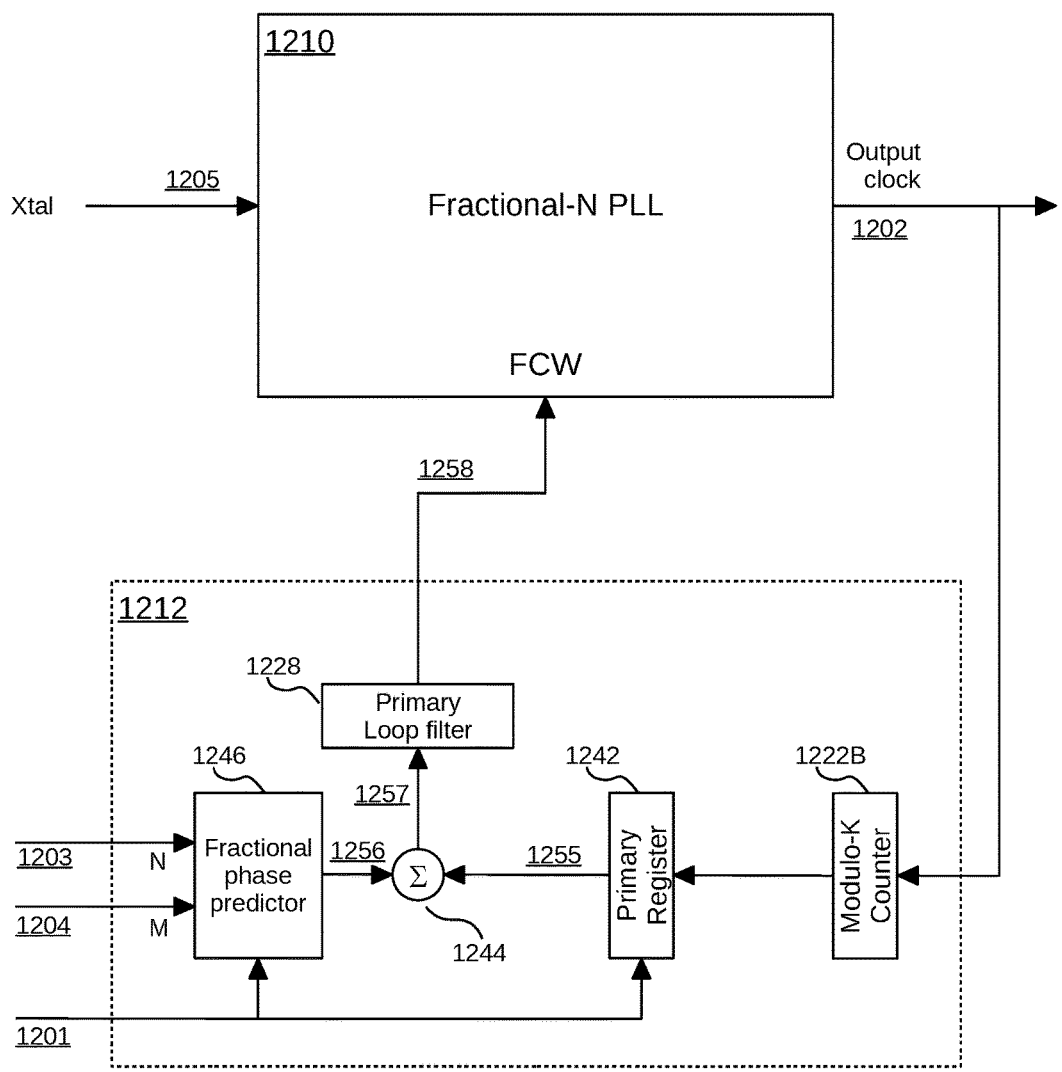
FIG. 12 illustrates a jitter attenuator according to an embodiment of the invention.

FIG. 12 illustrates a jitter attenuator 1200 according to an embodiment of the invention. The concept of a jitter attenuator is that a primary loop can lock to a primary reference clock signal with poor jitter behavior, whose frequency must be followed by an output clock signal, and that a secondary loop creates the actual output clock signal, based on the phase and stability of a secondary reference clock signal. By using different characteristics for loop filters for the primary loop and the secondary loop, embodiments can set different output clock phase noise spectra for the two different reference clock signal sources. For example, the active primary loop may determine the average frequency and lowest frequency phase noise, whereas the secondary loop may determine phase noise at higher frequencies. This can be accomplished by using a primary loop filter bandwidth that is much smaller than a secondary loop filter bandwidth, for example at least one hundred times smaller.

Jitter attenuator 1200 comprises a primary loop 1212 and a secondary loop 1210 which includes a fractional-N PLL. Primary loop 1212 includes a primary modulo-K counter 1222B whose input is coupled with a clock output of the fractional-N PLL in secondary loop 1210. A primary register 1242 has an input coupled with the primary modulo-K counter output, and a sample input that is clocked by a primary reference clock signal 1201 received at a primary reference clock signal 1201 input. Primary modulo-K counter 1222B measures the phase of the fractional-N PLL output clock signal 1202, and primary register 1242 samples the phase upon receiving a primary reference clock signal 1201 pulse to obtain sampled phase 1255. Primary loop 1212 further includes primary fractional phase predictor 1246, which has an input for primary reference clock signal 1201. Primary fractional phase predictor 1246 calculates a primary predicted phase 1256 upon receiving a primary reference clock signal 1201 pulse. Primary predicted phase 1256 includes an integer number and is based on a rational number primary frequency control word (FCW) that may include integer part 1203 (N) and fractional part 1204 (M). Primary subtractor or adder 1244 calculates an integer number primary difference 1257 between the primary predicted phase 1256 and the primary sampled phase 1255. Primary loop filter 1228 filters the primary difference 1257 to obtain secondary FCW 1258. Secondary FCW 1258 may include a rational number.

Secondary loop 1210 includes a first input which is configured for receiving a stable reference clock signal 1205, for example from a crystal oscillator, and a second input configured for receiving the secondary FCW 1258. Its output is configured to provide an output clock signal based on the stable reference clock signal and the secondary FCW.

Figure 13:
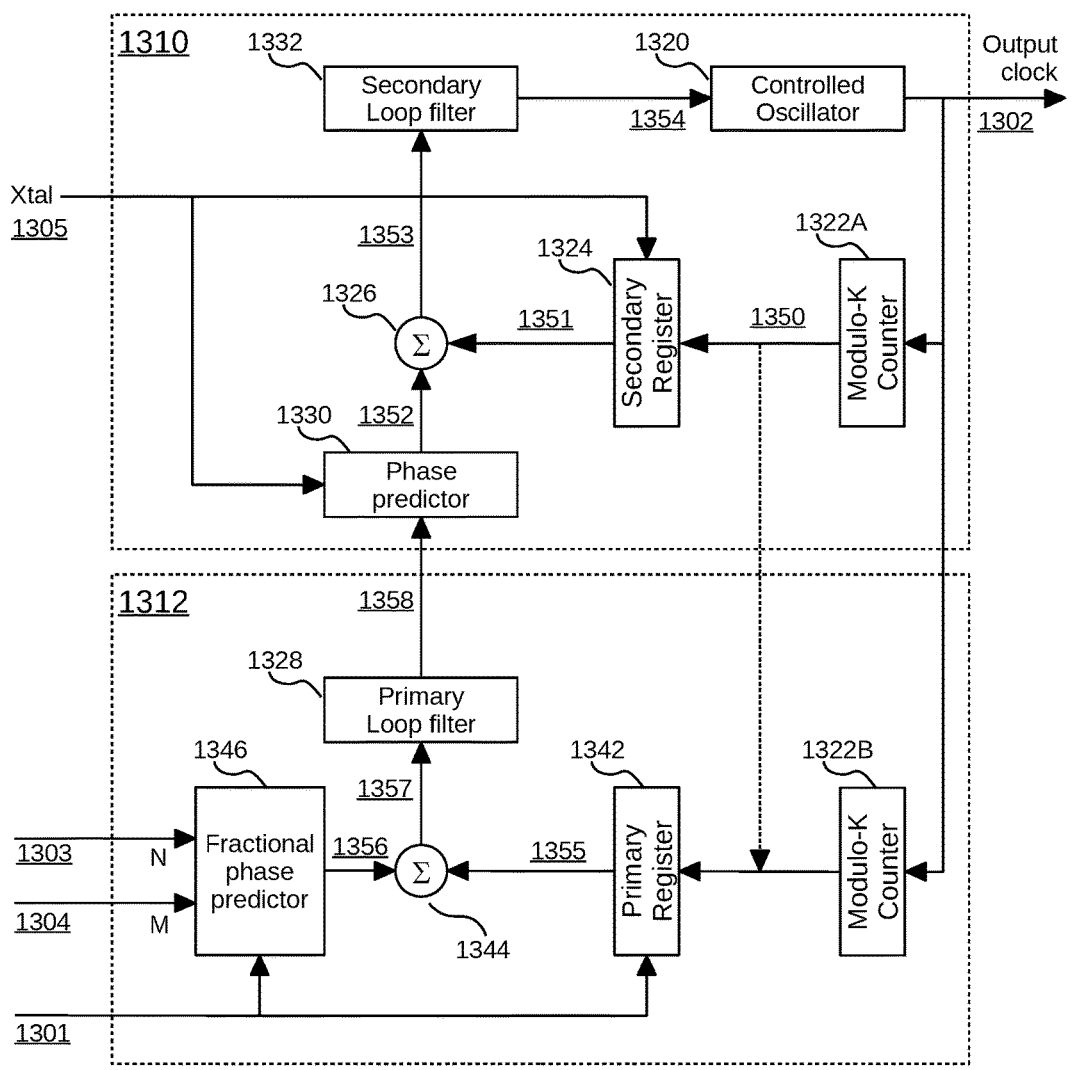
FIG. 13 illustrates a jitter attenuator with additional details according to some embodiments of the invention.

FIG. 13 illustrates a jitter attenuator 1300 with additional details according to some embodiments of the invention. Jitter attenuator 1300 has an architecture similar to jitter attenuator 1200 in FIG. 12. Similar numbered blocks and signals in FIG. 13 have the same meanings and functions as in FIG. 12.

Figure 14:
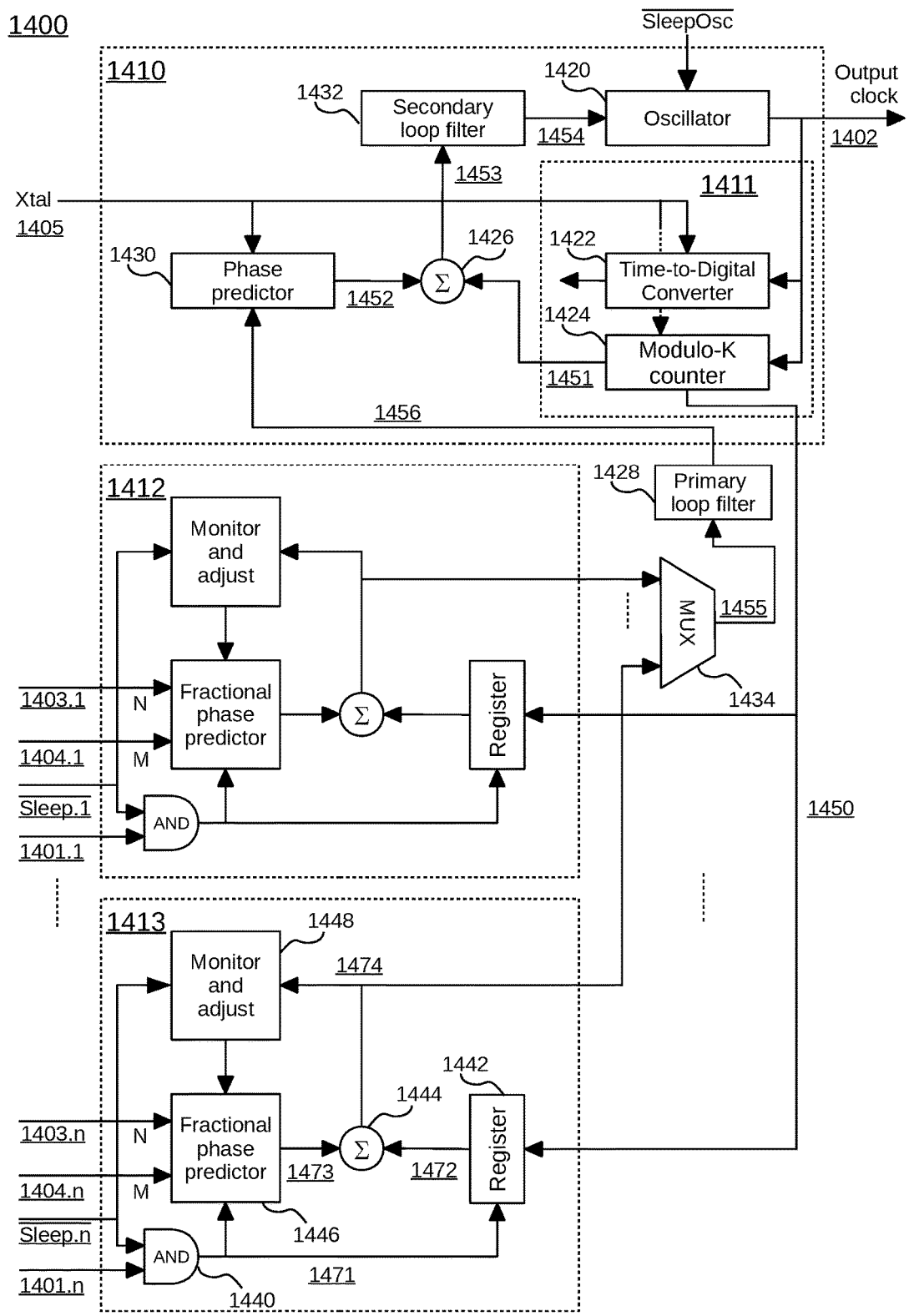
FIG. 14 illustrates details of a jitter attenuator with multiple primary loops according to an embodiment of the invention.

Its fractional-N PLL in secondary loop 1310 includes controlled oscillator 1320, modulo-K counter 1322A, secondary register 1324, phase predictor 1320, secondary subtractor or adder 1326, and secondary loop filter 1332. Controlled oscillator 1320 generates output clock signal 1302, which is also forwarded to modulo-K counter 1322A which outputs measured phase signal 1350. In some embodiments, modulo-K counter 1322A and 1325B may be combined into a single modulo-K counter, providing measured phase signal 1350 both to primary register 1342 and secondary register 1324. Secondary register 1324, upon receiving a secondary reference clock signal 1305 pulse, samples measured phase signal 1350 and delivers secondary sampled phase 1351 to secondary subtractor 1326. Phase predictor 1330, clocked by secondary reference clock signal 1305, calculates secondary predicted phase 1352. Secondary subtractor 1326 calculates a secondary difference 1353 between secondary predicted phase 1352 and secondary sampled phase 1351, and forwards secondary difference 1353 to secondary loop filter 1332, which integrates and filters secondary difference 1353 to provide oscillator control signal 1354 to control the frequency of controlled oscillator 1320. The secondary sampled phase 1351, secondary predicted phase 1352, and secondary difference 1353 may be limited to integer numbers, as discussed in reference to earlier PLLs in this patent document, or they may include rational numbers as illustrated in FIG. 14. Secondary loop filter 1332 may include a digital filter and/or an analog filter. Oscillator control signal 1354 may include a digital code, or an analog signal such as a voltage and/or a current. Controlled oscillator 1320 may include a digital-to-analog converter.

FIG. 14 illustrates details of a jitter attenuator 1400 with multiple primary loops according to an embodiment of the invention. It combines elements of the low-power hitless switching PLL in FIG. 9 with the jitter attenuator in FIG. 12 or 13. Jitter attenuator 1400 includes two or more parallel primary loops (shown in blocks 1412 and 1413) that share secondary loop 1410 functioning as a controlled oscillator. The primary loops have primary reference clock signal inputs 1401.1-1401.$n$, FCWs comprising integer part N 1403.1-1403.$n$ and fractional part M 1404.1-1404.$n$. In some embodiments, one or more of the loops may also have an input for loop sleep signal $\overline{\text{Sleep.1}}$-$\overline{\text{Sleep.n}}$. The secondary loop has a secondary reference clock signal 1405 input, which may, for example, be coupled to a crystal oscillator, and an output for output clock signal 1402.

Each primary loop includes a primary register (e.g., 1442) to sample measured phase 1450 at the output of modulo-K counter 1424 upon receiving a gated reference clock signal (e.g., 1471) pulse. The gated reference clock signal is derived from a primary reference clock signal (e.g., 1401.$n$) and a sleep control signal (e.g., $\overline{\text{Sleep.n}}$) through one or more logic gates, e.g., gate 1440. The primary register delivers a primary sampled phase (e.g., 1472) at its output.

A fractional phase predictor (e.g., 1446) calculates an integer primary predicted phase (e.g., 1473) based on a rational FCW, e.g., including integer part N 1403.$n$ and fractional part M 1404.$n$, and based on the number of gated reference clock signal pulses received via the one or more logic gates, e.g., gate 1440. A primary subtractor, e.g., 1444, subtracts the primary sampled phase from the primary predicted phase to obtain an integer primary phase difference (e.g., 1474). The embodiment provides the primary phase difference to a monitor and adjust block or function (e.g., 1448) and to multiplexer 1434. Multiplexer 1434 selects an active primary loop by passing its primary phase difference (e.g., 1474) as the selected primary phase difference 1455 to primary loop filter 1428, which calculates secondary FCW 1456 for the secondary loop 1410.

Secondary loop 1410 includes controlled oscillator 1420, modulo-K counter 1424 including a secondary register (not drawn) to output secondary sampled phase 1451, phase predictor 1430, secondary subtractor or adder 1426, and secondary loop filter 1432. Controlled oscillator 1420 generates output clock signal 1402, which is also forwarded to modulo-K counter 1424, which further outputs measured phase 1450. The secondary register, upon receiving a secondary reference clock signal 1405 pulse, samples measured phase signal 1450 and delivers secondary sampled phase 1451 to secondary subtractor 1426. Phase predictor 1430, clocked by secondary reference clock signal 1405, calculates secondary predicted phase 1452. Secondary subtractor 1426 calculates a secondary difference 1453 between secondary predicted phase 1452 and secondary sampled phase 1451, and forwards secondary difference 1453 to secondary loop filter 1432, which integrates and filters secondary difference 1453 to provide oscillator control signal 1454 to control the frequency of controlled oscillator 1420. The secondary sampled phase 1451, secondary predicted phase 1452, and secondary difference 1453 may be limited to integer numbers, as discussed in reference to earlier PLLs in this patent document, or they may include rational numbers as illustrated here. Phase sampler 1411 may include time-to-digital converter 1422 to measure fractions of cycles of output clock signal 1402 in relation to active edges of secondary reference clock signal 1405. An embodiment may scale an output value of time-to-digital converter 1422 and add it to the output value of modulo-K counter 1424 to produce a rational value for secondary sampled phase 1451. The use of rational values for 1451-1453 may lead to exceptionally low jitter in output clock signal 1402, although at the expense of extra complexity (inclusion of time-to-digital converter 1422) and higher power consumption.

Modulo-K counter 1424, fractional phase predictor 1446, and phase predictor 1430 need to be able to track the phase of the output clock signal over a sufficiently large range. For modulo-K counter 1424 this range equals K: upon reaching a counted value of K−1, the counter continues counting at 0. Naturally, the range K needs to be large enough to count $R_N$ cycles of output clock signal 1402 during one cycle of primary reference clock signal 1401.*n*. To correct large phase errors, or to relock at the correct phase after lock has been temporarily lost, embodiments of the invention may use a large range K, for instance K>>$R_N$. For example, the range K of the modulo-K counter 1424 may be at least two times larger than a maximum number of output clock signal cycles $R_N$ during a reference clock signal cycle. Thus, the maximum value of a phase error is not limited by the period of primary reference clock signal 1401.*n*, but by the larger of K and a range of fractional phase predictor 1446. The range of fractional phase predictor 1446 has been clarified with reference to FIG. 2A. For phase predictor 1430, the same or similar concepts apply.

The monitor-and-adjust blocks (e.g. 1448 in block 1413) are active only for loops that are not selected by multiplexer 1434. Monitor-and-adjust blocks monitor the primary difference signals from the respective subtractors and adjust registers (not shown) inside fractional phase predictors to minimize the primary differences.

Any adjustment in the currently active loop can break the desired relationship between input and output frequency. The function of a monitor-and-adjust block is to maintain the minimum primary difference of a currently unused primary reference clock signal, and indicate if its frequency is at the desired ratio to the output clock signal.

The monitor-and-adjust blocks may also generate a signal (not shown) to indicate which primary reference clock signals have matching frequencies to the primary reference clock signal that jitter attenuator 1400 is currently locked to. A simpler embodiment of a monitor-and-adjust block just copies the primary sampled phase into a register (not shown) inside the fractional phase predictor so that the last prediction is effectively correct.

In embodiments of the invention, multiplexer 1434 can be replaced by an averaging block that creates an error signal replacing selected primary difference 1474 by averaging all the primary differences that are currently valid and whose monitor-and-adjust blocks have the primary difference associated with any valid primary reference clock signal 1401.1-1401.*n* close to zero. In this case, output clock signal 1402 is effectively locked to all valid inputs and altering the members of the valid set has an even smaller impact on phase.

An embodiment can be optimized to have less circuitry. For example, instead of individual monitor-and-adjust blocks, an embodiment may have a single monitor-and-adjust block that cycles through the fractional phase predictors of all active loops, adjusting only one at a time.

In some embodiments, a primary loop can have an individual sleep mode. This is illustrated in block 1413, where gate 1440 is configured to interrupt primary reference clock signal 1401.*n*. When primary loop sleep signal $\overline{\text{Sleep.n}}$ is asserted, gated reference clock signal 1471 is inactive, and fractional phase predictor 1446 cannot calculate updates for primary predicted phase 1473 and register 1442 cannot update primary sampled phase 1472. In further embodiments, primary loop sleep signal $\overline{\text{Sleep.n}}$ can also place monitor-and-adjust block 1448 in sleep mode, such that effectively all circuits in primary loop block 1413 are inactive. An embodiment whose primary loops are all in sleep mode may place loop filter 1428 in sleep mode, maintaining a constant output. When this occurs, the secondary loop enters a holdover mode, maintaining frequency lock to the secondary reference clock signal 1405, where the output clock signal 1402 frequency is determined by the last active primary loop.

An embodiment may further include sleep mode signal $\overline{\text{SleepOsc}}$, which can stop operation of controlled oscillator 1420. This type of sleep mode impacts all loops, and fully halts operation of jitter attenuator 1400.

FIG. 14 shows example jitter attenuator 1400 as an embodiment with up-counting modulo-K counter 1424 and an up-counting fractional phase predictors. Other embodiments may use down-counters and/or down-counting fractional phase predictors. Counting limits may be chosen different than 0 and K, for example K and 0, or 0 and −K, or any other set of integer values that differ by K. Some embodiments may use an adder instead of a subtractor, and calculate a sampled phase as a negative value. FIG. 14 shows example jitter attenuator 1400 as an embodiment with AND gates for gates 1440, and with the signals $\overline{\text{Sleep1}}$ and $\overline{\text{SleepOsc}}$ asserted negative. A person having ordinary skill in the art will know that gating of primary reference clock signals 1401.1-1401.*n* can just as easily be achieved with another type of gate, such as a NAND gate, an OR gate, a NOR gate, an XOR gate, a pass gate, and a combination of any number of those gates, and with either one or both of the sleep signals asserted positive. Such embodiments are fully within the scope and ambit of the invention.

FIG. 15 illustrates a method 1500 for jitter attenuation according to an embodiment of the invention. Method 1500 comprises the following steps.

Step 1510—in a primary PLL loop, based on a primary reference clock signal and a rational first FCW, calculating an integer primary predicted phase. Based on the primary reference clock signal and a secondary PLL loop output clock signal, sampling a phase at a counter output to obtain an integer primary sampled phase. The counter may be a modulo-K counter. Calculating a primary difference by subtracting the primary sampled phase from the primary predicted phase.

Step 1520—loop filtering the primary difference in a primary loop filter to obtain a second FCW.

Step 1530—forwarding the second FCW to a secondary loop.

Step 1540—based on the second FCW and a secondary reference clock signal, calculating a secondary predicted phase. Based on the secondary reference clock signal and the secondary PLL loop output clock signal, sampling a phase to obtain a secondary sampled phase. Calculating a secondary difference by subtracting the secondary sampled phase from the secondary predicted phase.

Step 1550—loop filtering the secondary difference in a secondary loop filter to obtain an oscillator control signal to control a controlled oscillator and to determine a frequency of the secondary PLL loop output clock signal.

Figure 16:
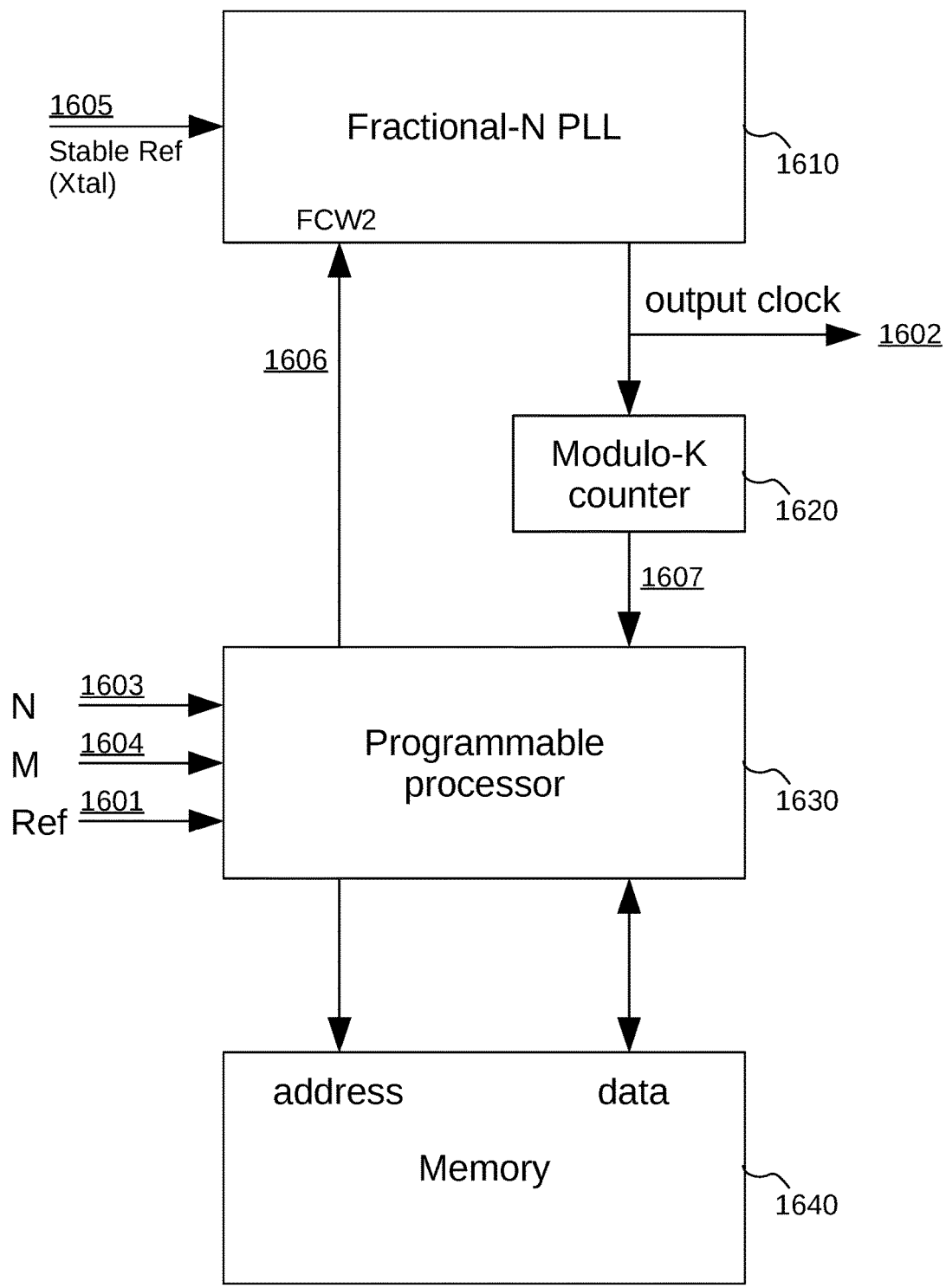
FIG. 16 illustrates a programmable system capable of implementing jitter attenuation methods according to embodiments of the invention.

FIG. 16 illustrates a programmable system 1600 capable of implementing jitter attenuation methods according to embodiments of the invention. System 1600 is a jitter attenuator that comprises a fractional-N PLL 1610, a modulo-K counter 1620, a programmable processor 1630, and a memory 1640. Memory 1640 may be tangible, and it may be non-transitory. Programmable processor 1630 is configured to store software instructions and/or data in memory 1640. Fractional-N PLL 1610 receives stable reference clock signal 1605 (for example, from a crystal oscillator). Programmable processor 1630 receives reference clock signal 1601, and a primary FCW comprising integer part N 1603 and fractional part M 1604. Programmable processor 1630 outputs secondary FCW 1606 to fractional-N PLL 1610. Fractional-N PLL 1610, whose frequency is controlled by secondary FCW 1606, outputs the output clock 1602. Modulo-K counter 1620 counts cycles of output clock 1602, and its output signal 1607 is a measure for the output clock phase, which it feeds back to programmable processor 1630. Some embodiments may store integer part N 1603 and fractional part M 1604 as parameters in memory 1640, either as part of the software instructions or as part of the data. Further embodiments may receive multiple reference clock signals, and may work with multiple FCWs. Yet further embodiments may use separate tangible non-transitory memories for software instructions and data.

Programmable processor 1630 is programmed to execute instructions for, for example, the following operations:

(a) in programmable processor 1630, based on the primary reference clock signal and a rational primary FCW, calculating an integer primary predicted phase; based on the primary reference clock signal and the fractional-N PLL 1610 output clock signal 1602, sampling a phase at the modulo-K counter 1620 output to obtain an integer primary sampled phase; calculating a primary difference by subtracting the primary sampled phase from the primary predicted phase;

(b) loop filtering the primary difference in a primary loop filter to obtain the secondary FCW; and (c) forwarding the secondary FCW to fractional-N PLL 1610 to control fractional-N PLL 1610 and to determine a frequency of the fractional-N PLL 1610 output clock signal 1602.

Figure 17:
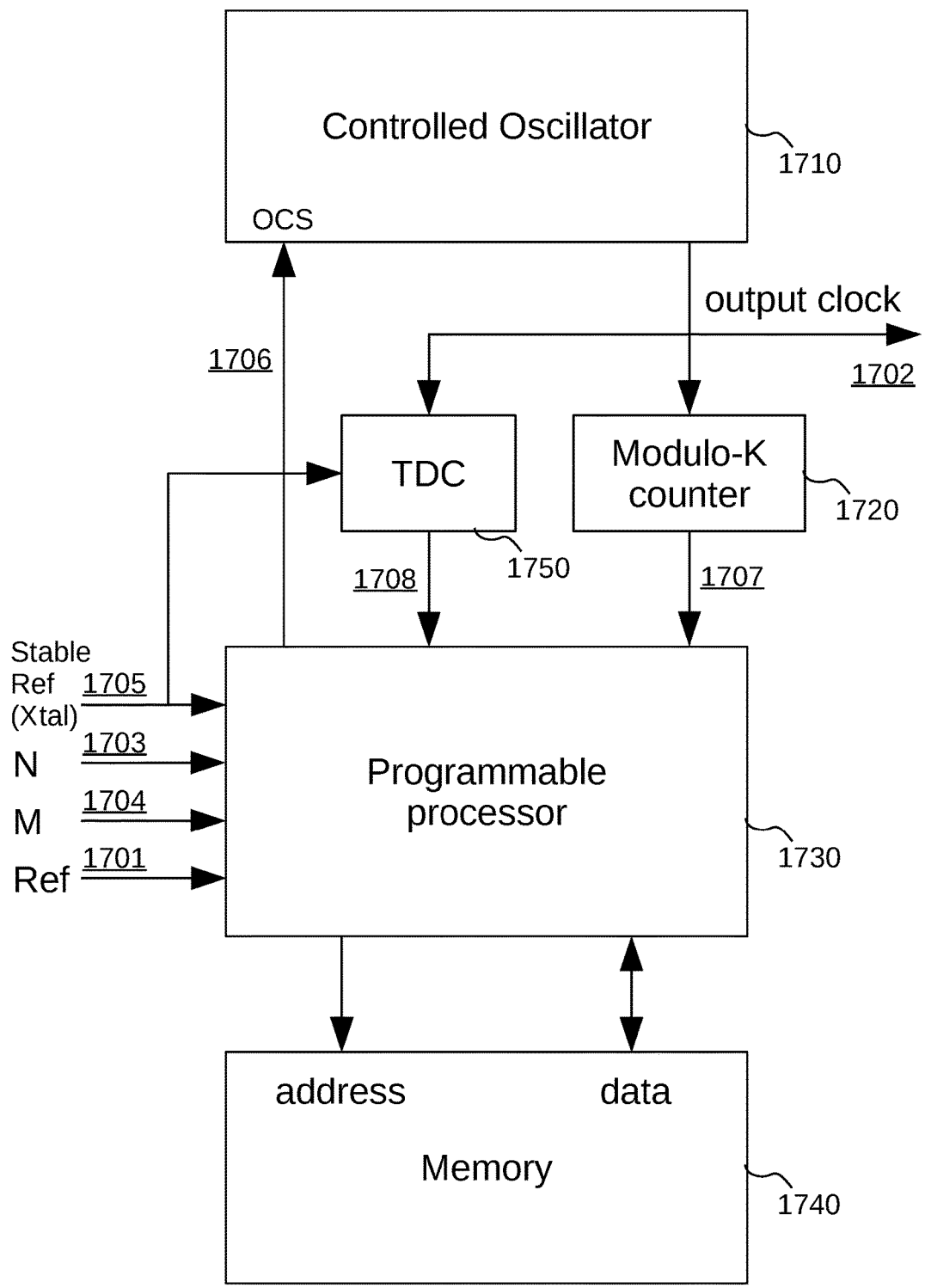
FIG. 17 illustrates another programmable system capable of implementing jitter attenuation methods according to embodiments of the invention.

FIG. 17 illustrates another programmable system, 1700, capable of implementing jitter attenuation methods according to embodiments of the invention. System 1700 is a jitter attenuator that comprises a controlled oscillator 1710, a modulo-K counter 1720, a programmable processor 1730, a memory 1740, and optionally a time-to-digital converter 1750. Memory 1740 may be tangible, and it may be non-transitory. Programmable processor 1730 is configured to store software instructions and/or data in memory 1740. Controlled oscillator 1710 receives oscillator control signal 1706 from programmable processor 1730. Oscillator control signal 1706 may include a digital code or an analog signal such as a voltage and/or a current. Programmable processor 1730 receives reference clock signal 1701, a primary FCW comprising integer part N 1703 and fractional part M 1704, and stable reference clock signal 1705, which may, for example, come from a crystal oscillator. Controlled oscillator 1710, whose frequency is controlled by oscillator control signal 1706, outputs the output clock 1702. Modulo-K counter 1720 counts cycles of output clock 1702, and its output signal 1707 is a measure for the output clock phase, which it feeds back to programmable processor 1730. Embodiments that include time-to-digital converter 1750 measure fractions of cycles of output clock signal 1702 in relation to active edges of stable reference clock signal 1705. An embodiment may scale an output value of time-to-digital converter 1750 and add it to the output value of modulo-K counter 1720 to produce a rational value for a secondary sampled phase, comprising integer part 1707 and fractional part 1708.

Some embodiments may store integer part N 1703 and fractional part M 1704 as parameters in memory 1740, either as part of the software instructions or as part of the data. Further embodiments may receive multiple reference clock signals, and may work with multiple FCWs. Yet further embodiments may use separate tangible non-transitory memories for software instructions and data.

Programmable processor 1730 is programmed to execute instructions for, for example, the following operations:

(a) based on a primary reference clock signal 1701 and a rational first FCW (1703, 1704), calculating an integer primary predicted phase. Based on the primary reference clock signal 1701 and controlled oscillator 1710 output clock signal 1702, sampling a phase at the modulo-K counter 1720 output to obtain an integer primary sampled phase. Calculating a primary difference by subtracting the primary sampled phase from the primary predicted phase.

(b) filtering the primary difference in a primary loop filter to obtain a second FCW.

(c) based on the second FCW and stable reference clock signal 1705, calculating a secondary predicted phase. Based on the secondary reference clock signal and the secondary PLL loop output clock signal, sampling a phase to obtain a secondary sampled phase. Calculating a secondary difference by subtracting the secondary sampled phase from the secondary predicted phase.

(d) filtering the secondary difference in a secondary loop filter to obtain an oscillator control signal 1706 to control controlled oscillator 1710 and to determine a frequency of the output clock signal 1702.

General

The headings contained in this specifications are for convenience only, and shall not be interpreted to limit, compartmentalize, or otherwise affect the description of the present invention.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive. For instance, many of the operations can be implemented on a printed card board PCB using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. All such variations and modifications are to be considered within the ambit of the present invention the nature of which is to be determined from the foregoing description.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments or parts of an embodiment may be implemented in a tangible, non-transitory computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A fractional-N PLL for maintaining phase lock over a sleep period, the PLL comprising:
a controlled oscillator configured to produce an oscillator signal at an oscillator output;
a first gate with a first input coupled with the oscillator output and a second input configured for receiving a first sleep mode control signal, and with an output coupled with a PLL output, wherein the first gate is configured to pass the oscillator signal to the PLL output as a gated output clock signal when the first sleep mode control signal is not asserted, and to block the oscillator signal when the first sleep mode control signal is asserted;
a modulo-K counter with an input coupled with the first gate output;
a register with a first input coupled with the modulo-K counter and a second input configured for receiving a gated reference clock signal;
a fractional phase predictor with a first input configured for receiving the gated reference clock signal, wherein the fractional phase predictor is configured to calculate a predicted phase upon receiving a gated reference clock signal, and wherein the predicted phase includes an integer number and is based on a rational number frequency control word (FCW);
a second gate with a first input configured to receive a reference clock signal and a second input configured for receiving the first sleep mode control signal, and with an output coupled with the register and the fractional phase predictor to provide the gated reference clock signal, wherein the second gate is configured to pass the reference clock signal to the second gate output as the gated reference clock signal when the first sleep mode control signal is not asserted, and to block the reference clock signal when the first sleep mode control signal is asserted; and
one of a subtractor and an adder, configured for calculating an integer number difference between the predicted phase and an integer number stored in the register.

2. The PLL of claim 1, wherein the register includes a set of D-latches with enable inputs, wherein data inputs are coupled with the first register input, and the enable inputs are coupled with the second register input.

3. The PLL of claim 1, wherein a range K of the modulo-K counter is at least two times larger than a maximum number of output clock signal cycles during a reference clock signal cycle.

4. The PLL of claim 1, wherein the fractional phase predictor has a range that is at least two times larger than a maximum number of output clock signal cycles during a reference clock signal cycle.

5. The PLL of claim 1, wherein the fractional phase predictor includes an interpolator for determining an integer number part of the predicted phase based on a fractional part of the FCW.

6. The PLL of claim 5, wherein the interpolator performs a noise-shaping function to move at least a part of quantization noise energy from low frequencies to higher frequencies.

7. The PLL of claim 6, wherein the interpolator includes one of a sigma delta modulator, a bandpass sigma delta modulator, parallel sigma delta modulators, a multistage noise shaping (MASH) modulator, and a sturdy MASH (SMASH) modulator.

8. The PLL of claim 1, wherein the controlled oscillator is configured for receiving a second sleep mode control signal and for powering down when the second sleep mode control signal is asserted and for powering up when the second sleep mode control signal is de-asserted.

9. The PLL of claim 1, further comprising a D-latch enabled by the reference clock signal, wherein the D-latch is configured to receive the first sleep mode control signal on a data input, and wherein the D-latch has an output coupled with the first gate second input and the second gate second input to deliver a synchronized first sleep mode control signal.

10. The PLL of claim 1, configured to copy either a register value or the register value corrected for a current difference to a fractional phase predictor register upon receiving a first gated reference clock signal pulse after the first sleep mode control signal has been de-asserted.

11. The PLL of claim 1, further comprising a loop filter configured to receive the integer number difference and to provide a filtering function to provide an oscillator control signal, and configured to freeze the oscillator control signal when the first sleep mode control signal is asserted.

12. The PLL of claim 11, wherein the oscillator control signal includes one of a digital code and an analog signal.

13. The PLL of claim 1, comprising multiple loops, each with a register, a fractional phase predictor, and a second gate.

14. A method for maintaining phase lock in a PLL over a sleep period, wherein the PLL has an active mode and at least a first sleep mode, and the PLL is configured to receive a reference clock signal and at least a first sleep mode control signal, the method comprising the following steps:
(a) during active mode, upon receiving a reference clock signal pulse, determining a controlled oscillator's phase, determining a predicted phase, and adjusting a controlled oscillator frequency based on a difference between the controlled oscillator's phase and the predicted phase;

(b) receiving a change in the first sleep mode control signal;

(c) upon determining that the first sleep mode control signal is asserted: canceling the active mode, entering the first sleep mode, freezing a stored value of the controlled oscillator's phase and the value of the predicted phase, freezing a phase difference, freezing loop filter internal values and a resulting oscillator control signal, blocking the reference clock signal and a gated output clock signal; and (d) upon determining that the first sleep mode control signal is not asserted: canceling the first sleep mode, entering active mode, unfreezing the stored value of the controlled oscillator's phase and the value of the predicted phase, phase difference, loop filter internal values, and the resulting oscillator control signal, unblocking the reference clock signal and the gated output clock signal to obtain a gated output clock signal that is in phase lock with the reference clock signal, and continuing with step (a).

15. The method of claim 14, wherein step (c) further comprises continuing with step (b).

16. The method of claim 14, wherein step (d) further comprises determining an updated predicted phase by copying either an updated sampled phase or a corrected updated sampled phase to a register in a fractional phase predictor, wherein the corrected updated sampled phase includes the updated sampled phase minus a current difference.

17. The method of claim 14, further comprising the following steps:

(e) receiving a change in a second sleep mode control signal;

(f) upon determining that the second sleep mode control signal is asserted: entering a second sleep mode, stopping the controlled oscillator, and continuing with step (e); and (g) upon determining that the second sleep mode control signal is not asserted: canceling the second sleep mode, starting the controlled oscillator, and continuing with step (b).

18. The method of claim 14, wherein step (a) further comprises sampling the controlled oscillator's phase and storing it as an integer number.

19. The method of claim 14, wherein step (a) further comprises calculating the predicted phase as an integer number based on a positive rational FCW.

20. The method of claim 19, wherein calculating the predicted phase includes noise shaping.

21. A method to maintain approximate frequency lock in a PLL whose oscillator keeps running during a sleep period, wherein the PLL has an active mode and at least a first sleep mode, and the PLL is configured to receive a reference clock signal and at least a first sleep mode control signal, the method comprising the following steps:

(a) during active mode, upon receiving a reference clock signal pulse, determining a controlled oscillator's phase, determining a predicted phase, and adjusting a controlled oscillator frequency based on a difference between the controlled oscillator's phase and the predicted phase;

(b) receiving a change in the first sleep mode control signal;

(c) upon determining that the first sleep mode control signal is asserted: canceling the active mode, entering the first sleep mode, freezing a stored value of the controlled oscillator's phase and the value of the predicted phase, freezing a phase difference, freezing loop filter internal values and a resulting oscillator control signal, blocking the reference clock signal, and continuing to make available an ungated output clock signal as a signal in approximate frequency lock with the reference clock signal; and (d) upon determining that the first sleep mode control signal is not asserted: canceling the first sleep mode, entering active mode, unblocking the reference clock signal, unblocking an output clock signal from a PLL feedback path, and continuing with step (a).

22. The method of claim 21, wherein step (c) further comprises continuing with step (b).

23. The method of claim 21, wherein step (d) further comprises determining an updated predicted phase by copying either an updated sampled phase or a corrected updated sampled phase to a register in a fractional phase predictor, wherein the corrected updated sampled phase includes the updated sampled phase minus a current difference.

24. The method of claim 21, further comprising the following steps:

(e) receiving a change in a second sleep mode control signal;

(f) upon determining that the second sleep mode control signal is asserted: entering a second sleep mode, stopping the controlled oscillator, and continuing with step (e);

(g) upon determining that the second sleep mode control signal is not asserted: canceling the second sleep mode, starting the controlled oscillator, continuing with step (b).

25. The method of claim 21, wherein:

step (a) further comprises sampling the controlled oscillator's phase and storing it as an integer number;

step (a) further comprises calculating the predicted phase as an integer number based on a positive rational FCW; and calculating the predicted phase includes noise shaping.

* * * * *